United States Patent
Yang et al.

(10) Patent No.: US 11,133,421 B2
(45) Date of Patent: Sep. 28, 2021

(54) SEMICONDUCTOR DEVICE

(71) Applicant: SAMSUNG ELECTRONICS CO., LTD., Suwon-si (KR)

(72) Inventors: Moon Seung Yang, Hwaseong-si (KR); Eun Hye Choi, Suwon-si (KR); Seung Mo Kang, Seongnam-si (KR); Yong Seung Kim, Hwaseong-si (KR); Jung Taek Kim, Seoul (KR); Min-Hee Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/808,857

(22) Filed: Mar. 4, 2020

(65) Prior Publication Data

US 2020/0395489 A1    Dec. 17, 2020

(30) Foreign Application Priority Data

Jun. 11, 2019   (KR) .......................... 10-2019-0068541

(51) Int. Cl.
| | | |
|---|---|---|
| *H01L 29/786* | (2006.01) | |
| *H01L 29/06* | (2006.01) | |
| *H01L 29/66* | (2006.01) | |
| *H01L 21/02* | (2006.01) | |
| *H01L 29/423* | (2006.01) | |

(52) U.S. Cl.
CPC .. *H01L 29/78696* (2013.01); *H01L 21/02603* (2013.01); *H01L 29/0673* (2013.01); *H01L 29/42392* (2013.01); *H01L 29/66545* (2013.01); *H01L 29/66742* (2013.01)

(58) Field of Classification Search
CPC ......... H01L 29/41775; H01L 29/41791; H01L 27/0886; H01L 29/42392
See application file for complete search history.

(56) References Cited

U.S. PATENT DOCUMENTS

| | | |
|---|---|---|
| 8,778,768 B1 | 7/2014 | Chang et al. |
| 9,548,381 B1 | 1/2017 | Krishnan et al. |
| 9,570,609 B2 | 2/2017 | Obradovic et al. |
| 9,768,252 B2 | 9/2017 | Holland et al. |
| 9,911,592 B2 | 3/2018 | Doris et al. |
| 9,997,596 B2 | 6/2018 | Choi et al. |
| 10,170,637 B2 | 1/2019 | Cheng et al. |
| 2006/0216897 A1* | 9/2006 | Lee ........................ B82Y 10/00 438/282 |
| 2015/0243733 A1* | 8/2015 | Yang ................... H01L 29/0673 257/401 |
| 2017/0162651 A1* | 6/2017 | Suk ................... H01L 29/66439 |
| 2018/0148645 A1* | 5/2018 | Lee ................... H01L 21/32134 |

(Continued)

*Primary Examiner* — Changhyun Yi
(74) *Attorney, Agent, or Firm* — Lee IP Law, PC

(57) ABSTRACT

A semiconductor device includes a fin-type pattern on a substrate, the fin-type pattern extending in a first direction and protruding from the substrate in a third direction, a first wire pattern on the fin-type pattern, the first wire pattern being spaced apart from the fin-type pattern in the third direction, and a gate electrode extending in a second direction, which is perpendicular to the first and third directions, and surrounding the first wire pattern, the gate electrode including a first portion that overlaps with the fin-type pattern in the second direction and a second portion corresponding to a remainder of the gate electrode except for the first portion.

18 Claims, 39 Drawing Sheets

(56) References Cited

U.S. PATENT DOCUMENTS

2019/0051535 A1 2/2019 Bi et al.
2019/0051729 A1 2/2019 Zhou
2019/0051734 A1 2/2019 Lin et al.

* cited by examiner

SEMICONDUCTOR DEVICE

CROSS-REFERENCE TO RELATED APPLICATION

Korean Patent Application No. 10-2019-0068541, filed on Jun. 11, 2019, in the Korean Intellectual Property Office, and entitled: "Semiconductor Device," is incorporated by reference herein in its entirety.

BACKGROUND

1. Field

Embodiments relate to a semiconductor device.

2. Description of the Related Art

In accordance with the rapid spread of information media, the functions of semiconductor devices have been remarkably developed. For recent semiconductor products, low production cost for improving competitiveness and high integration density for providing high quality have been required. In order to increase the integration density of semiconductor products, scaling-down may be performed on semiconductor devices.

SUMMARY

Embodiments are directed to a semiconductor device, including a fin-type pattern on a substrate, the fin-type pattern extending in a first direction and protruding from the substrate in a third direction, a first wire pattern on the fin-type pattern, the first wire pattern being spaced apart from the fin-type pattern in the third direction, and a gate electrode extending in a second direction, which is perpendicular to the first and third directions, and surrounding the first wire pattern, the gate electrode including a first portion that overlaps with the fin-type pattern in the second direction and a second portion corresponding to a remainder of the gate electrode except for the first portion.

Embodiments may also provide a semiconductor device, including a fin-type pattern protruding from a substrate, and a first wire pattern on the fin-type pattern, the first wire pattern being spaced apart from the fin-type pattern in a third direction. A distance between a top surface of the fin-type pattern and an end of the first wire pattern may be the same as or greater than distances between the top surface of the fin-type pattern and parts of the first wire pattern other than the end.

Embodiments may also provide a semiconductor device, including a fin-type pattern protruding from a substrate, the fin-type pattern having a top surface that does not include portions that protrude in a direction in which the fin-type pattern protrudes from the substrate, a wire pattern spaced apart from the fin-type pattern, and a gate electrode surrounding the wire pattern.

BRIEF DESCRIPTION OF THE DRAWINGS

Features will become apparent to those of skill in the art by describing in detail example embodiments with reference to the attached drawings in which.

DETAILED DESCRIPTION

Semiconductor devices according to example embodiments are illustrated in the accompanying drawings as, for example, a multibridge-channel field-effect transistor (MBCFET) including a nanowire-type or nanosheet-type channel region, but examples of a semiconductor device according to an example embodiment may include a tunneling field-effect transistor (FET), a fin FET (FinFET), a gate-all-around FET (GAAFET), and a three-dimensional (3D) transistor and may further include a bipolar junction transistor, a laterally diffused metal oxide semiconductor (LDMOS) transistor, and the like.

A semiconductor device according to an example embodiment will hereinafter be described with reference to FIGS. 1 through 5. For convenience, isolation films such as a shallow trench isolation (STI) are not illustrated in FIGS. 1 through 5.

Figure 1:
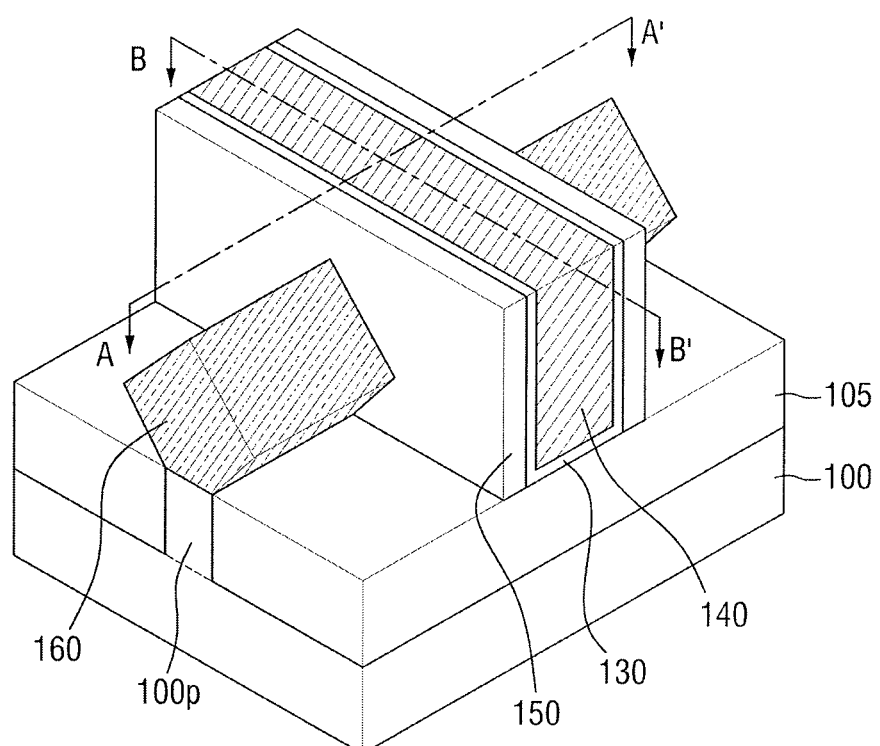
FIG. 1 illustrates a perspective view of a semiconductor device according to an example embodiment.
Figure 2:
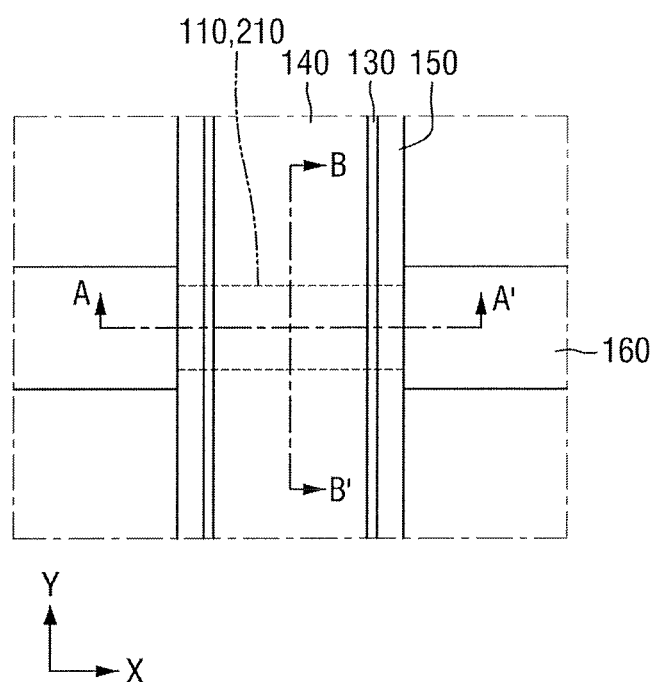
FIG. 2 illustrates a plan view of the semiconductor device of FIG. 2.
Figure 3:
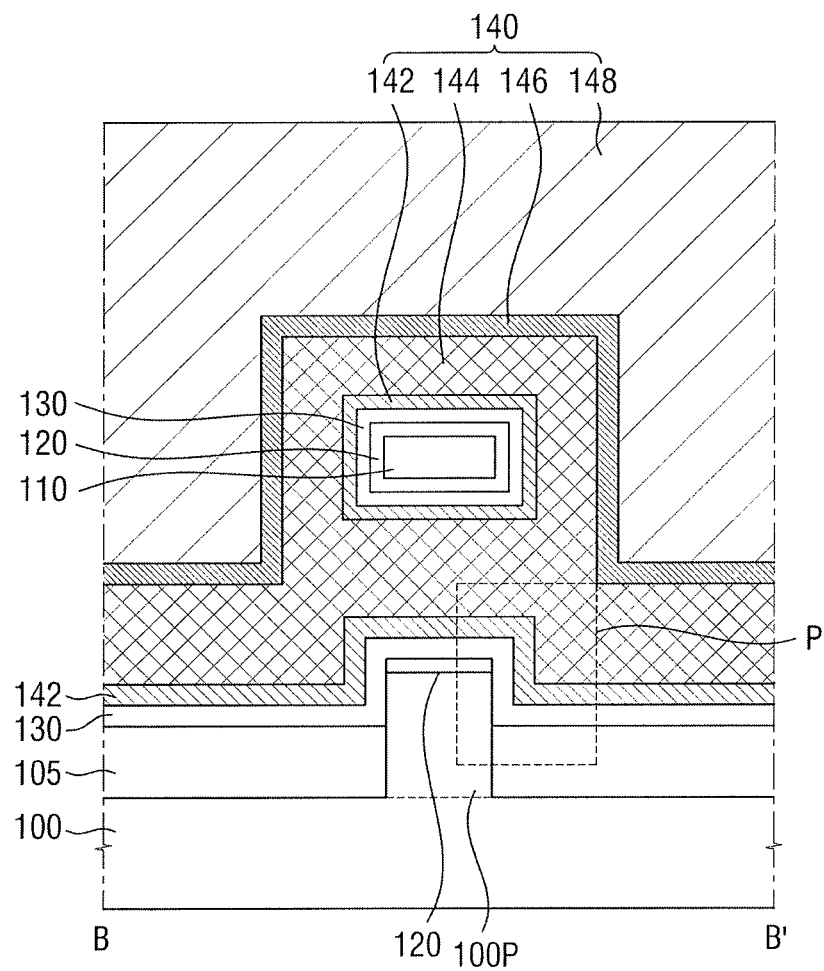
FIG. 3 illustrates a cross-sectional view taken along line B-B' of FIG. 2.
Figure 4:
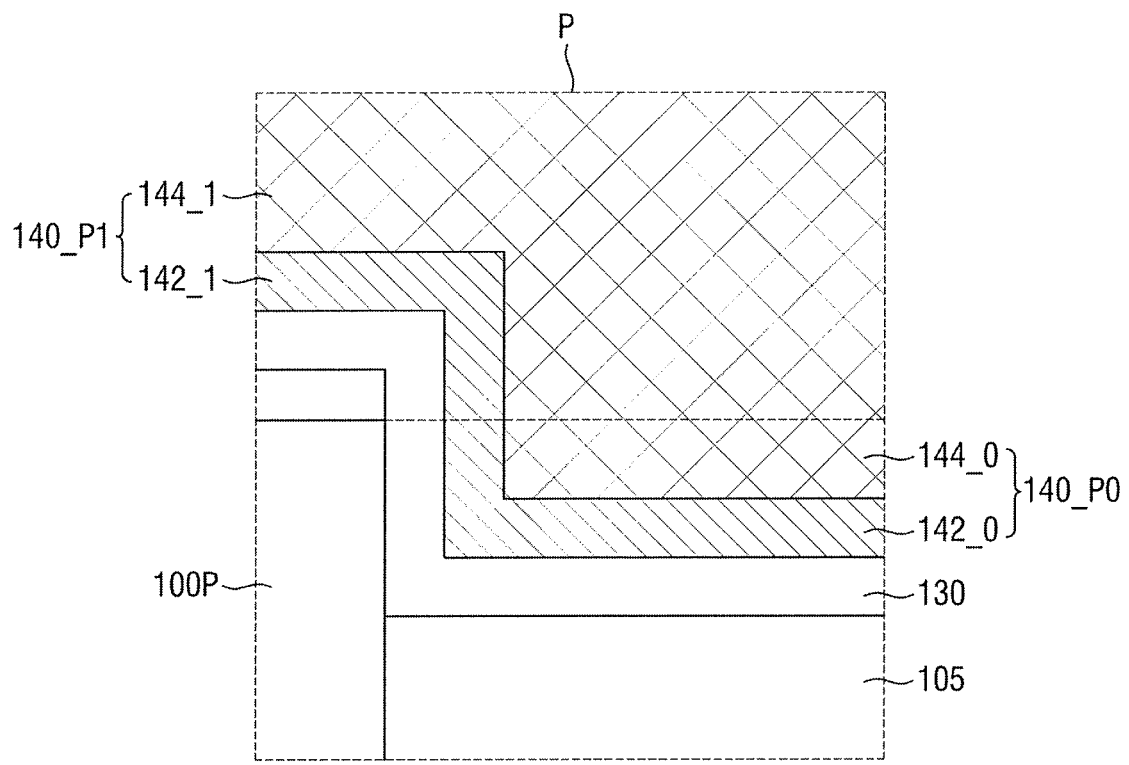
FIG. 4 illustrates an enlarged cross-sectional view of an area P of FIG. 3.
Figure 5:
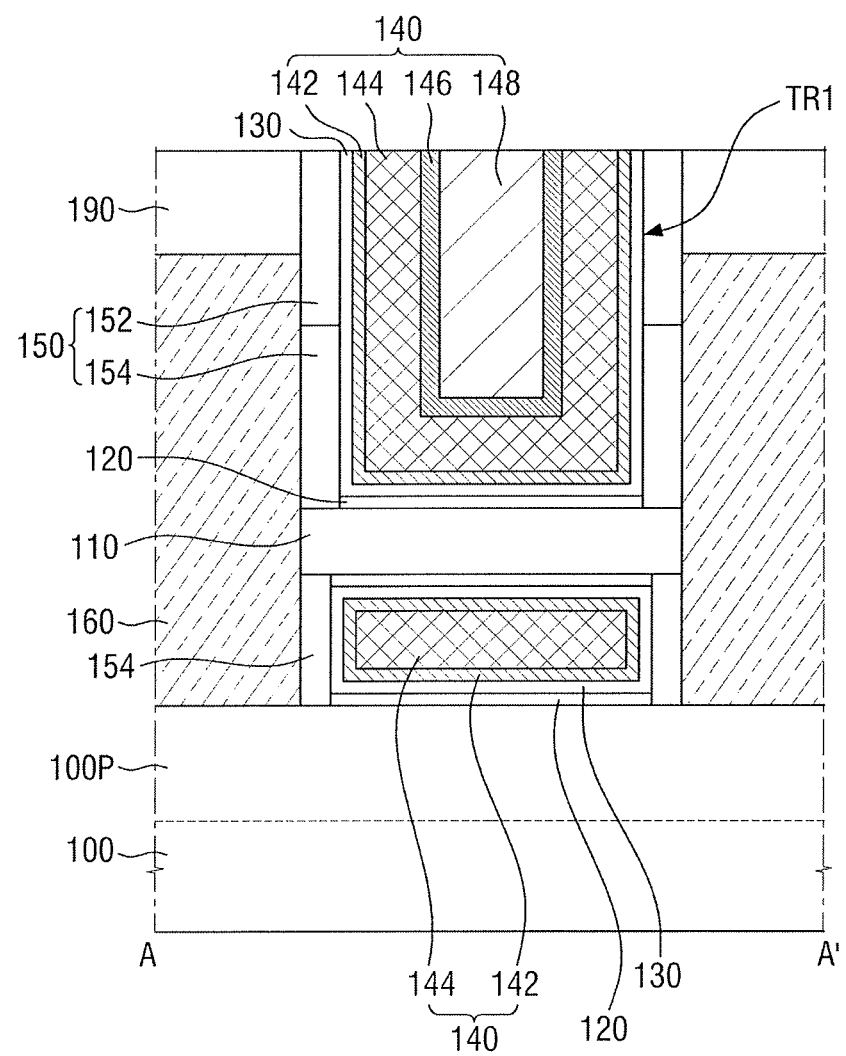
FIG. 5 illustrates a cross-sectional view taken along line A-A' of FIG. 2.

FIG. 1 illustrates a perspective view of a semiconductor device according to an example embodiment. FIG. 2 illustrates a plan view of the semiconductor device of FIG. 2. FIG. 3 illustrates a cross-sectional view taken along line B-B' of FIG. 2. FIG. 4 illustrates an enlarged cross-sectional view of an area P of FIG. 3. FIG. 5 illustrates a cross-sectional view taken along line A-A' of FIG. 2.

Referring to FIGS. 1 through 5, the semiconductor device includes a substrate 100, a field insulating film 105, a first wire pattern 110, an interfacial film 120, a gate insulating film 130, a gate electrode 140, gate spacers 150, source/drain regions 160, and an interlayer insulating film 190.

The substrate 100 may be a bulk silicon substrate or a silicon-on-insulator (SOI) substrate. In an implementation, the substrate 100 may be a silicon (Si) substrate or may include another material such as, for example, silicon germanium (SiGe), SiGe-on-insulator (SGOI), indium antimonide, a lead tellurium compound, indium arsenide, indium phosphide, gallium arsenide, or gallium antimonide, etc.

In an implementation, the substrate 100 may be an epitaxial layer formed on a base substrate. For convenience, the substrate 100 will hereinafter be described as being a substrate including Si.

The substrate 100 may include a fin-type protrusion 100P. The fin-type protrusion 100P may also be referred to as a "fin-type pattern". The fin-type protrusion 100P may protrude from the top surface of the substrate 100 and may extend in a first direction X. The fin-type protrusion 100P may be formed by etching part of the substrate 100 or may be an epitaxial layer grown from the substrate 100.

The fin-type protrusion 100P may include a semiconductor element material such as, for example, Si or germanium (Ge). Also, the fin-type protrusion 100P may include a compound semiconductor. For example, the fin-type protrusion 100P may include a group IV-IV compound semiconductor or a group III-V compound semiconductor. The group III-V compound semiconductor may be a binary, ternary, or quaternary compound obtained by combining at least one group III element such as aluminum (Al), gallium (Ga), and indium (In) and at least one group V element such as phosphorus (P), arsenic (As), and antimony (Sb).

The field insulating film 105 may be formed on the substrate 100. The field insulating film 105 may surround at least part of the sidewalls of the fin-type protrusion 100P. The fin-type protrusion 100P may be defined in part by the field insulating film 105.

The field insulating film 105 may include at least one of, for example, an oxide film, a nitride film, an oxynitride film, and a combination thereof.

The first wire pattern 110 may be disposed on the substrate 100. The first wire pattern 110 may be spaced apart from the substrate 100. The first wire pattern 110, like the fin-type protrusion 100P, may extend in the first direction X.

The first wire pattern 110 may be formed above the fin-type protrusion 100P to be spaced apart from the fin-type protrusion 100P. The first wire pattern 110 may vertically overlap with the fin-type protrusion 100P. In an implementation, the first wire pattern 110 may be formed on the fin-type protrusion 100P and not on the field insulating film 105.

The first wire pattern 110 may include a semiconductor element material such as, for example, Si or Ge. Also, the first wire pattern 110 may include a compound semiconductor. For example, the first wire pattern 110 may include a group IV-IV compound semiconductor or a group III-V compound semiconductor. The first wire pattern 110 may include the same material as, or a different material from, the fin-type protrusion 100P.

The first wire pattern 110 may be used as the channel region of a transistor. For example, the first wire pattern 110 may be used as the channel region of a N-type metal oxide semiconductor (NMOS) transistor. In another example, the first wire pattern 110 may be used as the channel region of a P-type metal oxide semiconductor (PMOS) transistor.

The interfacial film 120 may be formed along the circumference of the first wire pattern 110. The interfacial film 120 may surround, e.g., completely surround, the first wire pattern 110.

The interfacial film 120 may be formed on the fin-type protrusion 100P. As illustrated in FIG. 5, the interfacial film 120 may be formed on the bottom of a trench TR1. The interfacial film 120 is illustrated as not being formed on the sidewalls of the trench TR1, etc. but in an implementation, the interfacial film 120 may be formed on the sidewalls of the trench TR1 depending on how the interfacial film 120 is formed. In an example embodiment, the interfacial film 120 may not be provided.

The interfacial film 120 may include, for example, silicon oxide, etc. The interfacial film 120 may include a material other than silicon oxide depending on the type of the substrate 100, the type of the first wire pattern 110, or the type of the gate insulating film 130.

The gate insulating film 130 may be formed on the interfacial film 120. The gate insulating film 130 may be formed along the circumference of the first wire pattern 110. The gate insulating film 130 may surround, e.g., completely surround, the interfacial film 120.

The gate insulating film 130 may be formed on the top surface of the field insulating film 105 and on the fin-type protrusion 100P. The gate insulating film 130 may extend along the inner sidewalls of the gate spacers 150. Thus, the gate insulating film 130 may extend along the sidewalls and the bottom of the trench TR1 and along the circumference of the first wire pattern 110.

The gate insulating film 130 may include, for example, a high-permittivity material having a greater dielectric constant than silicon oxide, silicon nitride, and silicon oxynitride.

The gate electrode 140 may extend over the substrate 100 in a second direction Y that intersects the first direction X. As illustrated in FIG. 2, the gate electrode 140 may intersect the fin-type protrusion 100P and the first wire pattern 110.

The gate electrode 140 may be formed to surround, e.g., completely surround, the first wire pattern 110, and may be present in between the fin-type protrusion 100P and the first wire pattern 110.

The gate electrode 140 may be formed on the gate insulating film 130. The gate electrode 140 may fill the trench TR1.

The gate electrode 140 may include a lower conductive film 142, a work function film 144, a barrier film 146, and a filling conductive film 148.

The lower conductive film 142 may be formed on the gate insulating film 130. The lower conductive film 142 may be formed along the profile of the gate insulating film 130.

The lower conductive film 142 may be formed along the circumference of the first wire pattern 110. The lower conductive film 142 may surround, e.g., completely surround, the gate insulating film 130.

The lower conductive film 142 may also be formed on the top surface of the field insulating film 105 and on the fin-type protrusion 100P. The lower conductive film 142 may extend along the inner sidewalls of the gate spacers 150. Thus, the lower conductive film 142 may extend along the sidewalls and the bottom of the trench TR1 and along the circumference of the first wire pattern 110.

The lower conductive film 142 may include, for example, a metal nitride. For example, the lower conductive film 142 may include at least one of TiN, TaN, WN, and a combination thereof. The lower conductive film 142 may be formed to an appropriate thickness depending on the type of semiconductor device to be formed.

The lower conductive film 142 will hereinafter be described as including TiN.

In the process of fabricating the semiconductor device, the lower conductive film 142 may be used to cure oxygen atom defects in the gate insulating film 130. For example, the lower conductive film 142 may cure the oxygen atom defects in the gate insulating film 130 through thermal treatment.

The work function film 144 may be formed on the lower conductive film 142. The work function film 144 may be formed along the profile of the lower conductive film 142.

The work function film 144 may be formed along the circumference of the first wire pattern 110. Accordingly, the work function film 144 may surround the lower conductive film 142.

The work function film 144 may also be formed on the top surface of the field insulating film 105 and on the fin-type protrusion 100P. The work function film 144 may extend along the inner sidewalls of the gate spacers 150. Thus, the work function film 144 may extend along the sidewalls and the bottom of the trench TR1 and along the circumference of the first wire pattern 110.

The work function film 144 may include carbon (C). The work function film 144 may also include at least one of, for example, Ti, Ta, W, Ru, Nb, Mo, Hf, La, Al, and a combination thereof.

In an example embodiment, the work function film 144 may be an N-type work function film. For example, the work function film 144 may include TiAlC or TiAlCN. Also, for example, the work function film 144 may include a material obtained by replacing Ti in TiAlC or TiAlCN with one of Ta, W, Ru, Nb, Mo, Hf, and La.

The work function film 144 will hereinafter be described as including TiAlC.

The barrier film 146 may be formed on the work function film 144. The barrier film 146 may be formed along the profile of the work function film 144.

The barrier film 146 may also be formed on the top surface of the field insulating film 105 and on the fin-type protrusion 100P. The barrier film 146 may extend along the inner sidewalls of the gate spacers 150. Thus, the barrier film 146 may extend along the sidewalls and the bottom of the trench TR1.

Although not specifically illustrated, an oxide film may be interposed between the barrier film 146 and the work function film 144. The oxide film may be a film resulting from the natural oxidation of the surface of the work function film 144. For example, the oxide film may be formed due to the oxidation of the work function film 144 in the process of fabricating the semiconductor device.

In an example embodiment, the barrier film 146 may be in direct contact with the work function film 144. Thus, no intervening film may be disposed between the barrier film 146 and the work function film 144.

The filling conductive film 148 may be disposed on the barrier film 146. The filling conductive film 148 may fill part of the trench TR1 that remains unfilled after the formation of the interfacial film 120, the gate insulating film 130, the lower conductive film 142, the work function film 144, and the barrier film 146.

The filling conductive film 148 may include at least one of, for example, W, Al, Co, Cu, Ru, Ni, Pt, Ni—Pt, and a combination thereof.

The gate spacers 150 may be formed on both or opposite sidewalls of the gate electrode 140, the sidewalls extending in the second direction Y. For example, as illustrated in FIG. 5, the gate spacers 150 may be formed on both sides of the gate electrode 140 to face each other. The gate spacers 150 may define the trench TR1, which intersects the first wire pattern 110.

The gate spacers 150 may include outer spacers 152 and inner spacers 154. The inner spacers 154 may be disposed between the fin-type protrusion 100P and the first wire pattern 110. Although not specifically illustrated, the width, in the second direction Y, of the inner spacers 154 may be substantially the same as the width, in the second direction Y, of the first wire pattern 110.

The outer spacers 152 may be disposed on the inner spacers 154. FIG. 5 illustrates that the inner spacers 154 and the outer spacers 152 are sequentially disposed on the first wire pattern 110, etc. Thus, only the outer spacers 152 may be disposed on the first wire pattern 110 depending on the structure of a stack for forming the first wire pattern 110.

As illustrated in FIGS. 3 and 4, the gate electrode 140 may include a first portion 140_P0 that overlaps with the fin-type protrusion 100P in the second direction Y and a second portion 140_P1 that accounts for or corresponds to the rest of the gate electrode 140.

The first portion 140_P0 of the gate electrode 140 (which is disposed below the top surface of the fin-type protrusion 100P in a third direction Z) includes a first lower conductive film 142_0 and a first work function film 144_0.

The second portion 140_P1 of the gate electrode 140 (which is disposed above the top surface of the fin-type protrusion 100P in the third direction Z) includes a second lower conductive film 142_1 and a first work function film 144_1.

In an example embodiment, the distance between the first portion 140_P0 of the gate electrode 140 and the top surface of the fin-type protrusion 100P may be 50 nm or less.

Since the bottom of the gate electrode 140 (which does not overlap with the fin-type protrusion 100P) is formed below the top surface of the fin-type protrusion 100P in the third direction Z (the third direction Z being the direction in which the fin-type protrusion 100P protrudes), no protruding portions may be formed at the edges of the top surface of the fin-type protrusion 100P. Accordingly, channel roughness may be reduced, and as a result, the mobility of electric charge may be improved.

The source/drain regions 160 may be formed adjacent to the gate electrode 140. For example, as illustrated in FIG. 5, the source/drain regions 160 may be formed on both or opposite sidewalls of the gate electrode 140.

The source/drain regions 160 may include an epitaxial layer that is formed on the fin-type protrusion 100P. The source/drain regions 160 may be elevated source/drain regions whose top surfaces are above the top surface of the substrate 100. In another implementation, the source/drain regions 160 may be impurity regions formed in the substrate 100.

The interlayer insulating film 190 may be formed on the substrate 100. The interlayer insulating film 190 may surround the outer sidewalls of the gate spacers 150 that define the trench TR1.

The interlayer insulating film 190 may include at least one of, for example, silicon oxide, silicon nitride, silicon oxynitride, and a low-permittivity material.

Figure 6:
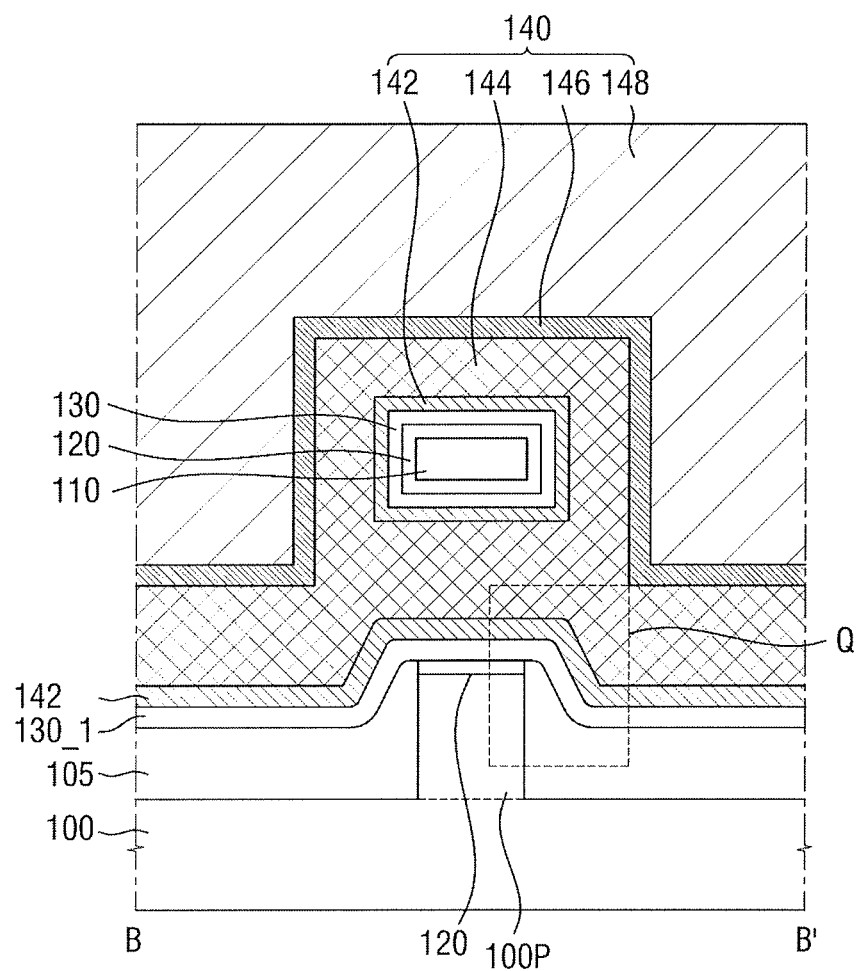
FIG. 6 illustrates a cross-sectional view, taken along line B-B' of FIG. 2, of a semiconductor device according to an example embodiment.
Figure 7:
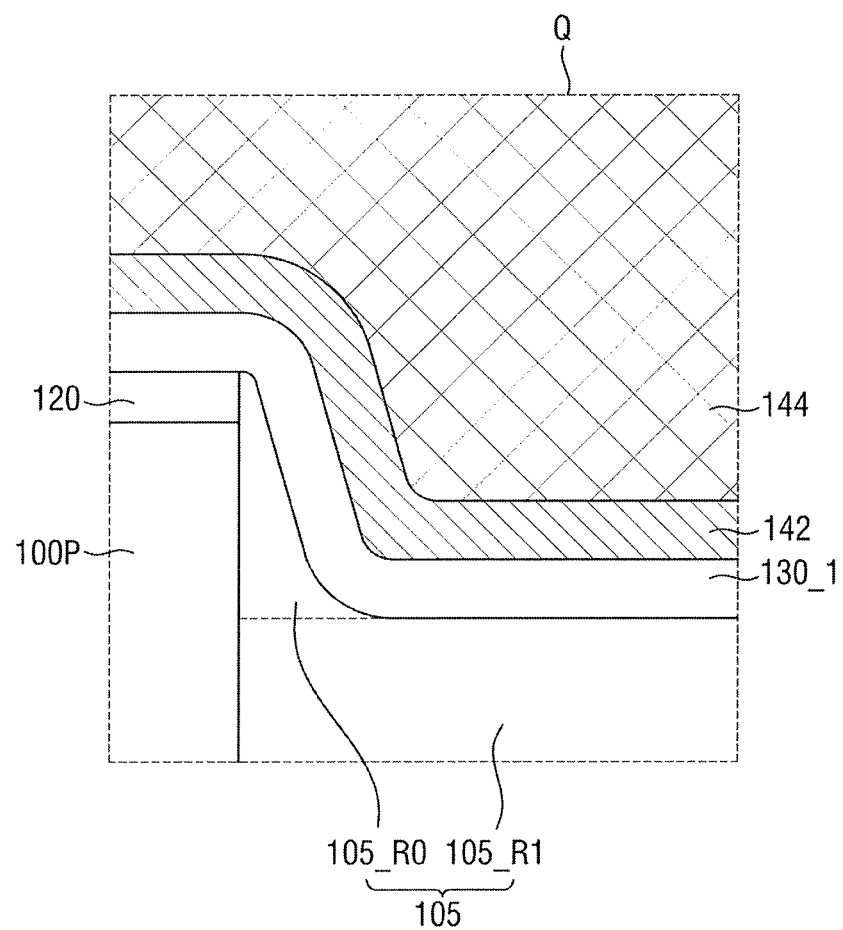
FIG. 7 illustrates an enlarged cross-sectional view of an area Q of FIG. 6.

FIG. 6 illustrates a cross-sectional view, taken along line B-B' of FIG. 2, of a semiconductor device according to an example embodiment, and FIG. 7 illustrates an enlarged cross-sectional view of an area Q of FIG. 6.

Referring to FIGS. 4, 6, and 7, the gate electrode 140 may include the first portion 140_P0 that overlaps with the fin-type protrusion 100P in the second direction Y and the second portion 140_P1 that accounts for or corresponds to the rest of the gate electrode 140. The distance between the sidewalls of the fin-type protrusion 100P and the gate electrode 140 may increase away (i.e., in the third direction Z) from the fin-type protrusion 100P. For example, the distance between the sidewalls of the fin-type protrusion 100P and the first portion 140_P0 of the gate electrode 140 may increase away from the top surface of the fin-type protrusion 100P.

In an example embodiment, the field insulating film 105 may be formed to at least partially surround both or opposite sidewalls of the fin-type protrusion 100P, and may define the fin-type protrusion 100P. The field insulating film 105 may include a first region 105_R0 that overlaps with the first portion 140_P0 of the gate electrode 140 in the second direction Y, and a second region 105_R1 that accounts for or corresponds to the rest of the field insulating film 105. Thus, the first region 105_R0 may be defined as a region that overlaps with the gate electrode 140 and the gate insulating film 130 in the second direction Y.

In further detail, as illustrated in FIGS. 6 and 7, the field insulating film 105 may include the first region 105_R0 that is formed above the bottom surface of the gate insulating film 130 and the second region 105_R1 that is formed below the bottom surface of the gate insulating film 130. Accordingly, the field insulating film 105 may be formed not to surround the entire sidewalls of the fin-type protrusion 100P, but to surround only portions of the sidewalls of the fin-type protrusion 100P. As illustrated in FIG. 7, the first region 105_R0 that is formed above the bottom surface of the gate insulating film 130 may have a wedge-like portion interposed between a sidewall of the fin-type protrusion 100P and a portion of the gate insulating film 130 that is laterally adjacent thereto.

Figure 8:
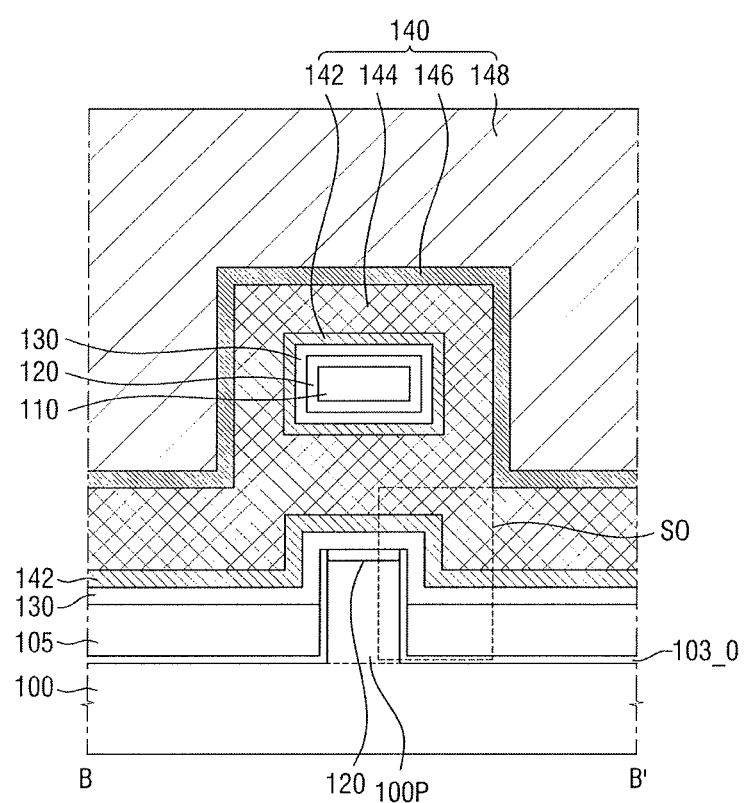
FIG. 8 illustrates a cross-sectional view, taken along line B-B' of FIG. 2, of a semiconductor device according to an example embodiment.
Figure 9:
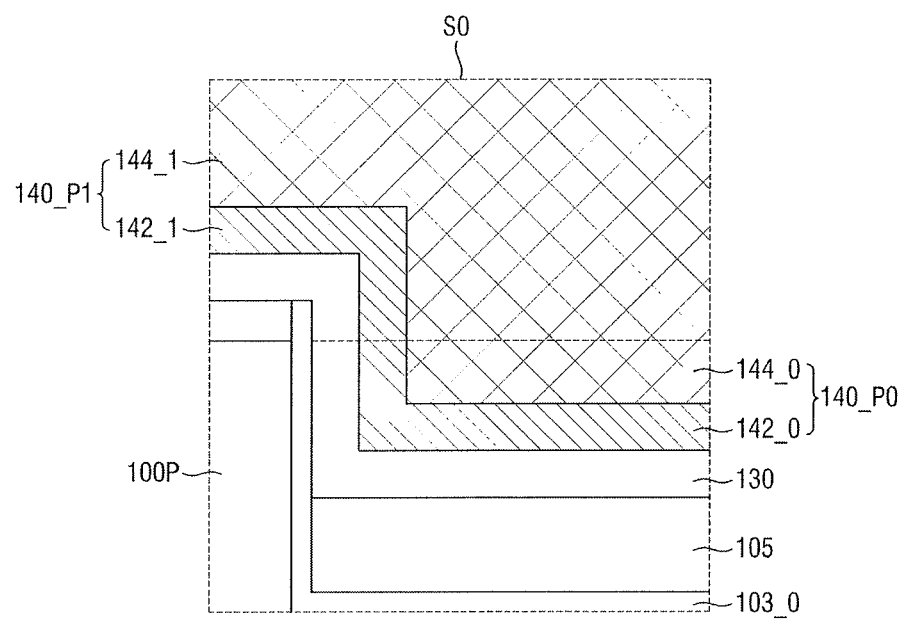
FIG. 9 illustrates an enlarged cross-sectional view of an area S0 of FIG. 8.

FIG. 8 illustrates a cross-sectional view, taken along line B-B' of FIG. 2, of a semiconductor device according to an example embodiment, and FIG. 9 illustrates an enlarged cross-sectional view of an area S0 of FIG. 8. The semiconductor device of FIGS. 8 and 9 will hereinafter be described, focusing mainly on the differences with the semiconductor device of FIG. 3.

Referring to FIGS. 8 and 9, the semiconductor device may further include a field liner 103_0. The field liner 103_0 may be formed between the field insulating film 105 and the substrate 100, between the field insulating film 105 and the fin-type protrusion 100P, between the gate insulating film 130 and the fin-type protrusion 100P, and between the gate insulating film 130 and the interfacial film 120. For example, the field liner 103_0 may be formed along the sidewalls of the fin-type protrusion 100P (which are surrounded by the field insulating film 105 and the gate insulating film 130), along the sidewalls of the interfacial film 120 (which are surrounded by the gate insulating film 130), and along the top surface of the substrate 100. The field liner 103_0 may be formed to protrude beyond the top surface of the field insulating film 105.

In another example embodiment, as compared to what is illustrated in FIGS. 8 and 9, the field liner 103_0 may not be formed on the sidewalls of the interfacial film 120. In this case, the field liner 103_0 may be formed to substantially the same height as the top of the fin-type protrusion 100P.

In an example embodiment, the field liner 103_0 may include at least one of polysilicon, amorphous silicon, silicon oxynitride, silicon nitride, and silicon oxide. In an example embodiment, the field liner 103_0 may be formed as a double layer including silicon oxide and one of polysilicon and amorphous silicon.

Figure 10:
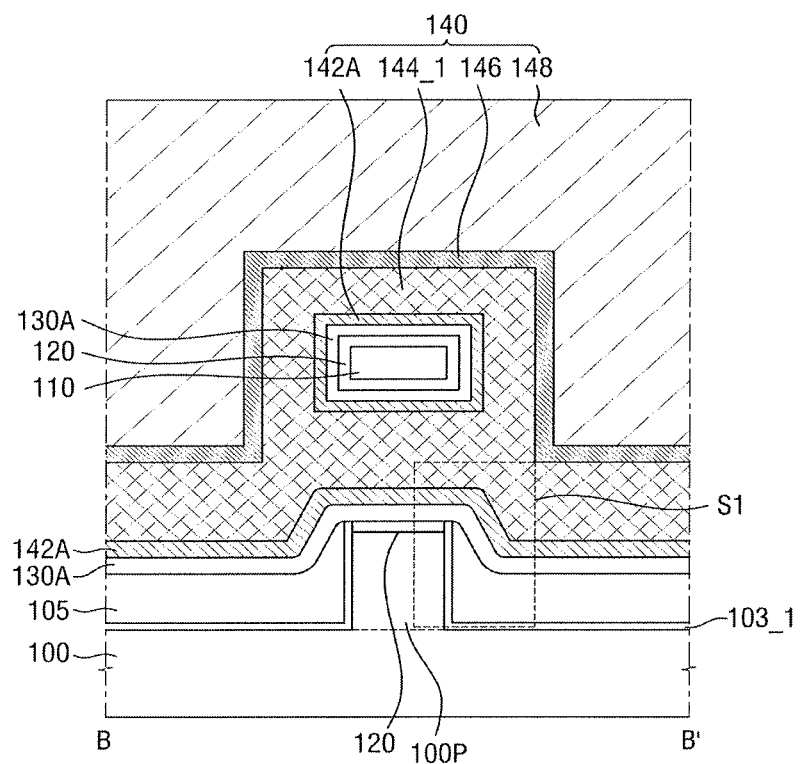
FIG. 10 illustrates a cross-sectional view, taken along line B-B' of FIG. 2, of a semiconductor device according to an example embodiment.
Figure 11:
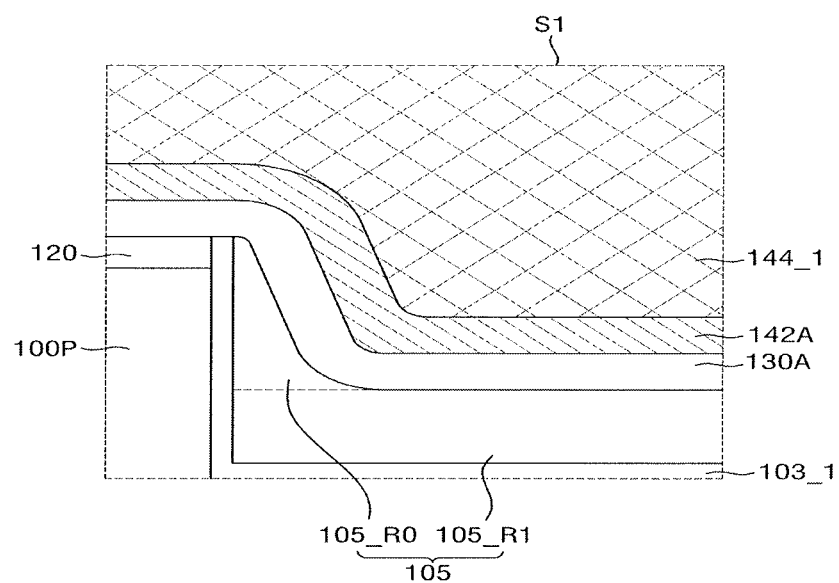
FIG. 11 illustrates an enlarged cross-sectional view of an area S1 of FIG. 10.

FIG. 10 illustrates a cross-sectional view, taken along line B-B' of FIG. 2, of a semiconductor device according to an example embodiment, and FIG. 11 illustrates an enlarged cross-sectional view of an area S1 of FIG. 10. The semiconductor device of FIGS. 10 and 11 will hereinafter be described, focusing mainly on the differences with the semiconductor device of FIG. 6.

Referring to FIGS. 10 and 11, the semiconductor device may further include a field liner 103_1. The field liner 103_1 may be formed below the second lower conductive film 142A and the first work function film 144_1, along the sidewalls of the fin-type protrusion 100P (which are surrounded by a field insulating film 105), along the sidewalls of the interfacial film 120, and along the top surface of the substrate 100. The field liner 103_1 may be in contact with at least part of the gate insulating film 130A. In an example embodiment, the field liner 103_1 may be formed not to protrude beyond the top surface of the field insulating film 105. Thus, the top surface of the field liner 103_1 and the top surface of the field insulating film 105 may have substantially the same height.

In an example embodiment, the distance in the second direction Y between the field liner 103_1 and the gate insulating film 130A may increase away from the top of the fin-type protrusion 100P (i.e., in a downward Z direction).

Figure 12:
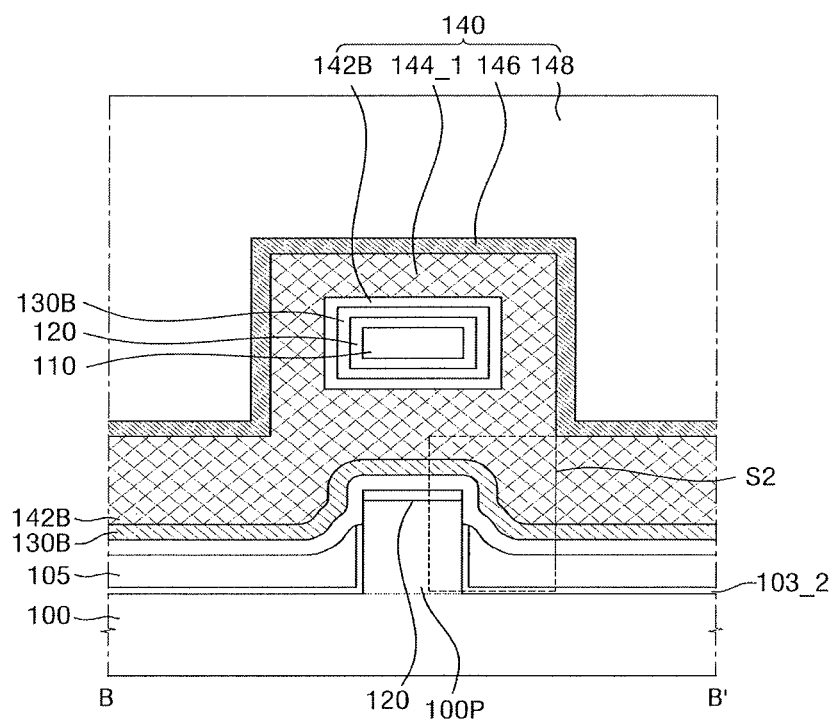
FIG. 12 illustrates a cross-sectional view, taken along line B-B' of FIG. 2, of a semiconductor device according to an example embodiment.
Figure 13:
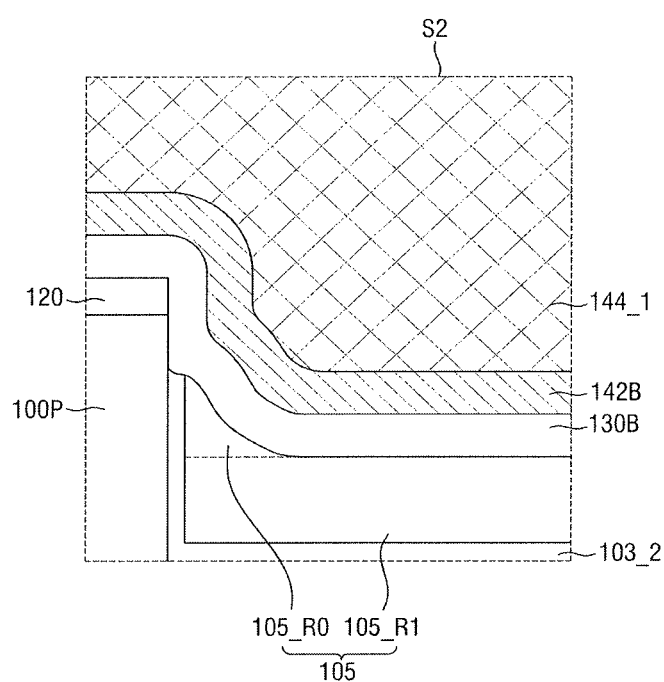
FIG. 13 illustrates an enlarged cross-sectional view of an area S2 of FIG. 12.

FIG. 12 illustrates a cross-sectional view, taken along line B-B' of FIG. 2, of a semiconductor device according to an example embodiment, and FIG. 13 illustrates an enlarged cross-sectional view of an area S2 of FIG. 12. The semiconductor device of FIGS. 12 and 13 will hereinafter be described, focusing mainly on the differences with the semiconductor device of FIG. 10.

Referring to FIGS. 12 and 13, the semiconductor device may further include a field liner 103_2. The field liner 103_2 may be formed along the top surface of the substrate 100 and along portions of the sidewalls of the fin-type protrusion 100P. The sidewalls of the fin-type protrusion 100P may include portions that are in contact with the field liner 103_2 and portions that are in contact with a gate insulating film 130B. The sidewalls of an interfacial film 120 may be formed to be in contact not with the field liner 103_2, but with the gate insulating film 130B.

Since the field liner 103_2 is formed to be in contact with portions of the sidewalls of the fin-type protrusion 100P, the bottom surfaces of the gate insulating film 130B, the lower conductive film 142B, and the work function film 144_1 may be formed to have inflection points.

Figure 14:
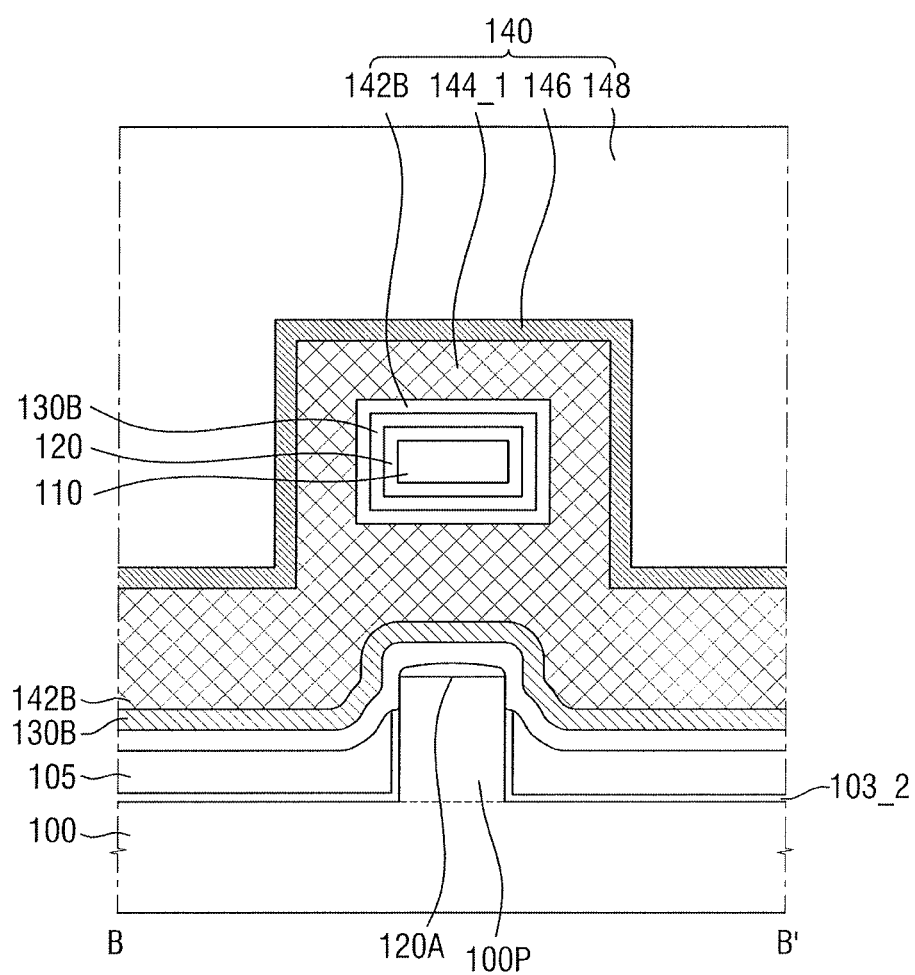
FIG. 14 illustrates a cross-sectional view, taken along line B-B' of FIG. 2, of a semiconductor device according to an example embodiment.

FIG. 14 illustrates a cross-sectional view, taken along line B-B' of FIG. 2, of a semiconductor device according to an example embodiment. The semiconductor device of FIG. 14 will hereinafter be described, focusing mainly on the differences with the semiconductor device of FIG. 12.

Referring to FIG. 14, the semiconductor device may include an interfacial film 120A that is formed on the top surface of the fin-type protrusion 100P and has smooth edges at the sidewalls and the top surface thereof.

Figure 15:
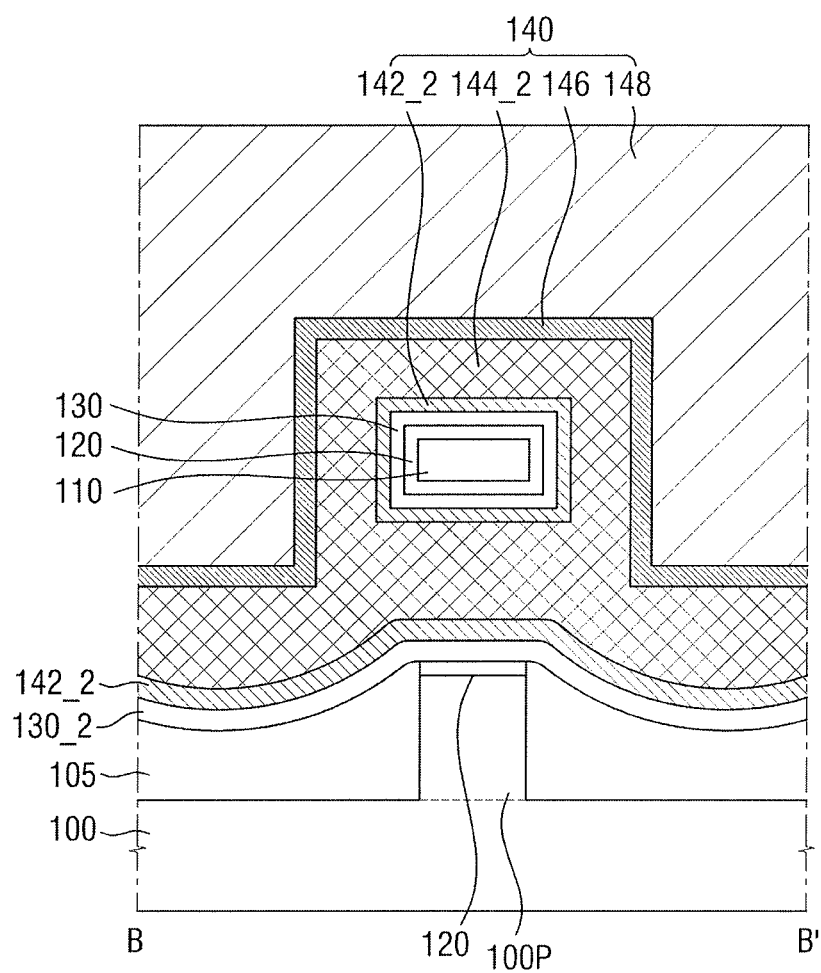
FIG. 15 illustrates a cross-sectional view, taken along line B-B' of FIG. 2, of a semiconductor device according to an example embodiment.

FIG. 15 illustrates a cross-sectional view, taken along line B-B' of FIG. 2, of a semiconductor device according to an example embodiment.

Referring to FIG. 15, the bottom surface of the gate electrode 140 may be formed to be recessed in the third direction Z, i.e., downwardly recessed in FIG. 15, e.g., forming a concave surface. In an example embodiment, the bottom surfaces of a gate insulating film 130_2, a lower conductive film 142_2, and a work function film 144_2 (which are formed on a fin-type protrusion 100P) may be formed to be recessed in the third direction Z. For example, the fin-type protrusion 100P may be formed to be recessed in the third direction Z from the substrate 100.

Figure 16:
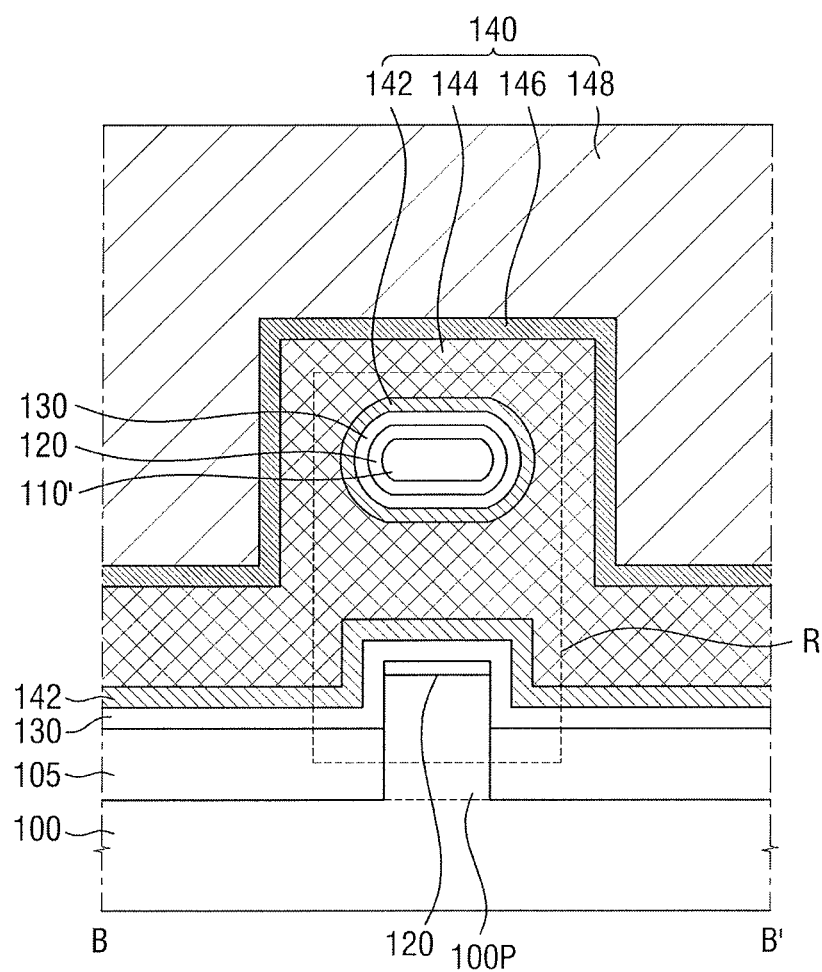
FIG. 16 illustrates a cross-sectional view, taken along line B-B' of FIG. 2, of a semiconductor device according to an example embodiment.
Figure 17:
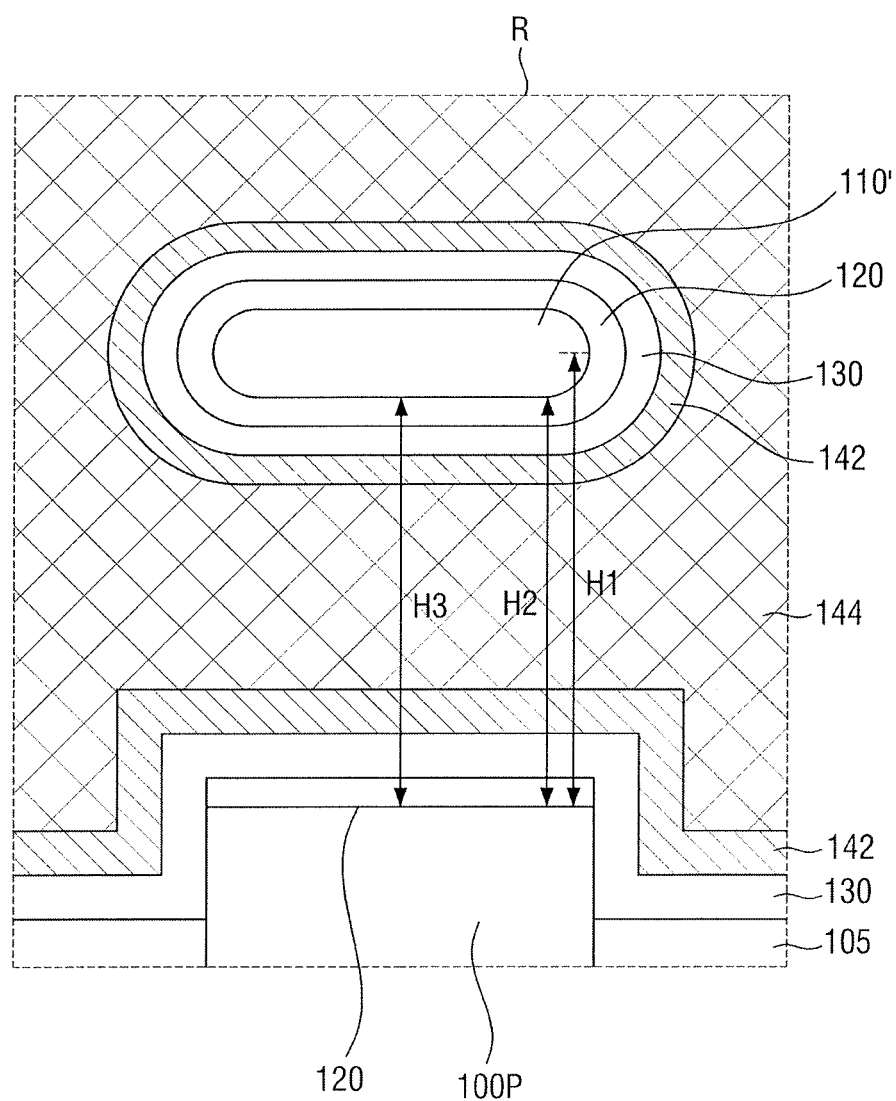
FIG. 17 illustrates an enlarged cross-sectional view of an area R of FIG. 16.

FIG. 16 illustrates a cross-sectional view, taken along line B-B' of FIG. 2, of a semiconductor device according to an example embodiment, and FIG. 17 illustrates an enlarged cross-sectional view of an area R of FIG. 16.

Referring to FIGS. 16 and 17, a first wire pattern 110' may be formed in the shape of a figure comprising a combination of straight lines and curves, e.g., a stadium shape. The cross section of the first wire pattern 110' may have, for example, a rectangular shape with rounded corners. In an implementation, the first wire pattern 110' may be formed in the shape of a figure comprising the combination of curves.

As illustrated in FIG. 17, a first distance H1 between either end of the first wire pattern 110' and the fin-type protrusion 100P may be greater than, or the same as, second and third distances H2 and H3 between other parts of the first wire pattern 110' and the fin-type protrusion 100P. For example, the cross section of the first wire pattern 110' may have a rectangular shape with rounded corners, the second distance H2 may be the distance from the center, in a second direction Y, of the first wire pattern 110' to the top surface of the fin-type protrusion 100P, and the third distance H3 may be the distance from any arbitrary point between the center and the end, in the second direction Y, of the first wire pattern 110' and the top surface of the fin-type protrusion 100P.

When the height at either end of the first wire pattern 110' is greater than the height at other parts of the first wire pattern 110', the channel roughness of a transistor may be improved, and as a result, the mobility of electric charge may be improved.

Figure 18:
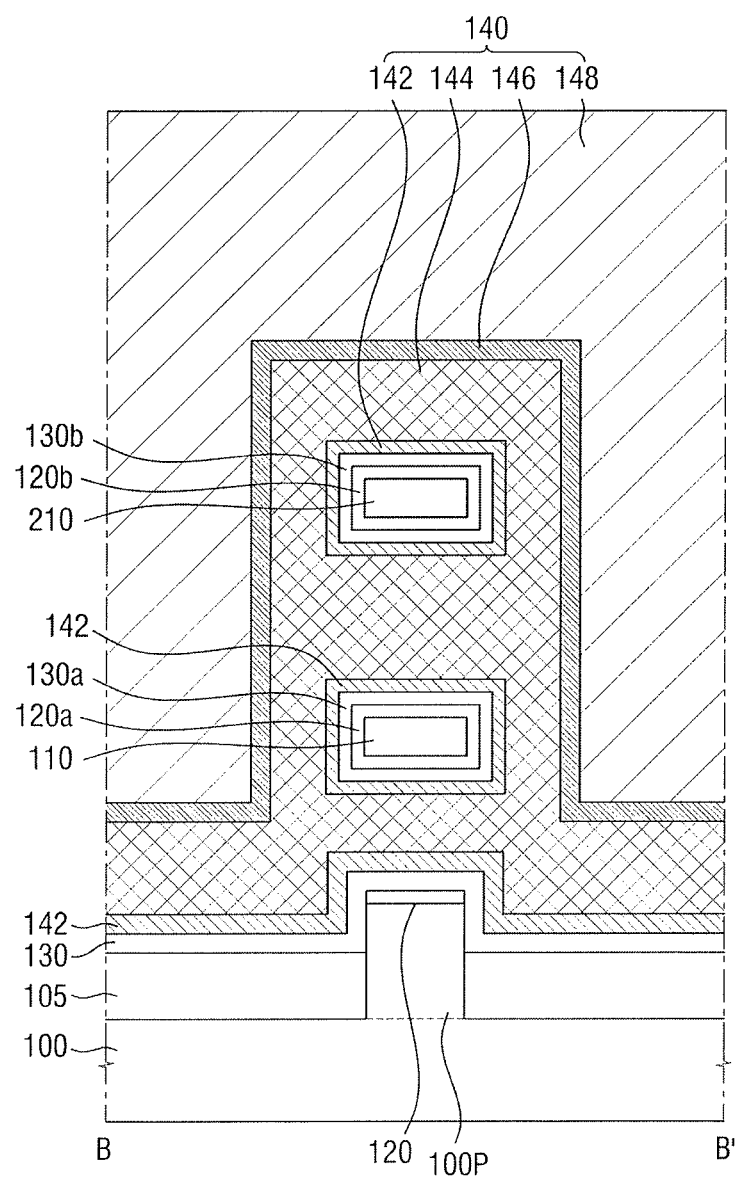
FIGS. 18 and 19 illustrate cross-sectional views, taken along lines B-B' and A-A', respectively, of FIG. 2, of a semiconductor device according to an example embodiment.
Figure 19:
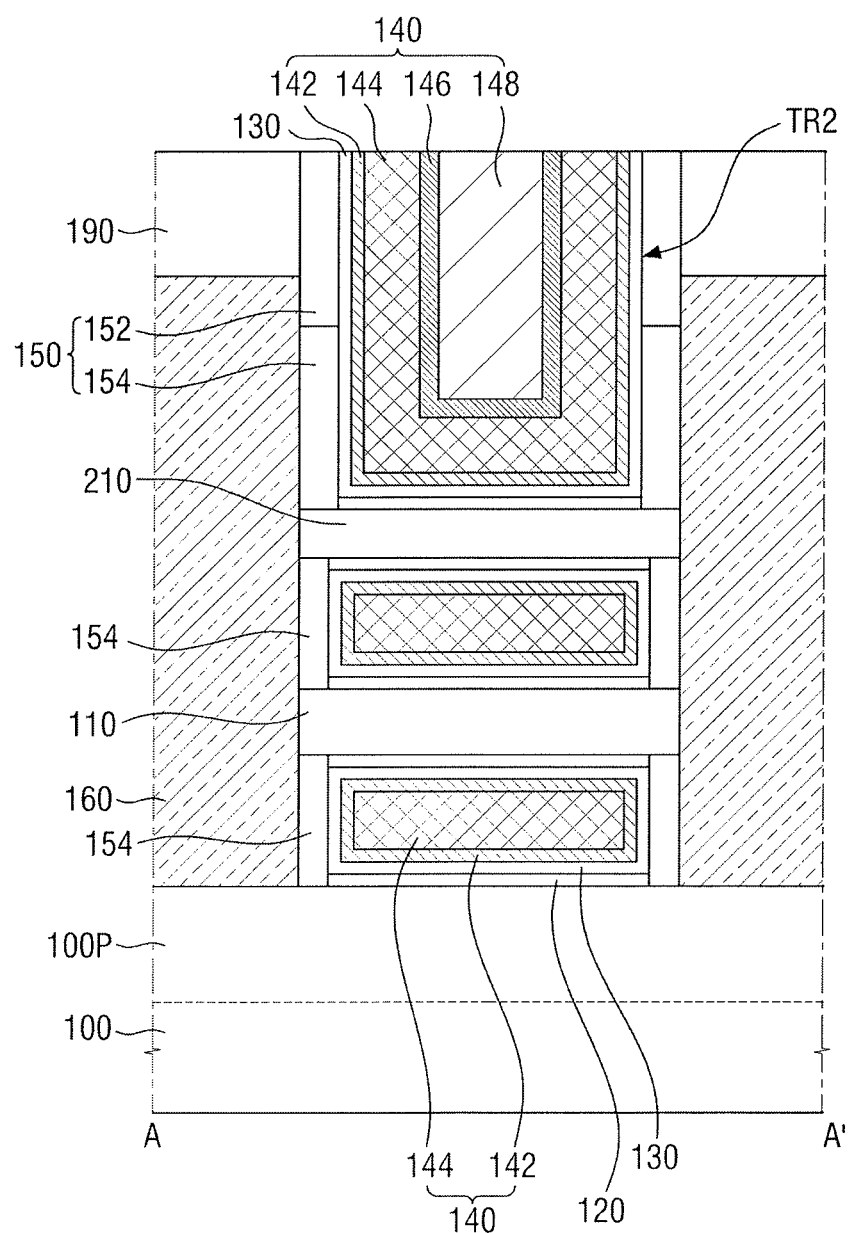

FIGS. 18 and 19 illustrate cross-sectional views, taken along lines B-B' and A-A', respectively, of FIG. 2, of a semiconductor device according to an example embodiment.

Referring to FIGS. 18 and 19, the semiconductor device may include a plurality of wire patterns, e.g., the first wire pattern 110 and a second wire pattern 210. FIGS. 18 and 19 illustrate that the semiconductor device includes two wire patterns but the semiconductor device may be configured to include three or more wire patterns. The semiconductor device of FIGS. 18 and 19 will hereinafter be described, focusing mainly on the differences with the semiconductor device of FIGS. 3 through 5, which includes only the first wire pattern 110.

The second wire pattern 210 may be disposed above the first wire pattern 110 and may be spaced apart from the first wire pattern 110. Thus, the second wire pattern 210 may be formed on the substrate 100 to be spaced apart in a third direction Z from the first wire pattern 110. The second wire pattern 210 may extend in the first direction X. Thus, the fin-type protrusion 100P, the first wire pattern 110, and the second wire pattern 210 may all extend in the same direction, e.g., in the first direction X.

The second wire pattern 210 may vertically overlap with the first wire pattern 110 and the fin-type protrusion 100P. Thus, the second wire pattern 210 may be formed not on the field insulating film 105, but on the fin-type protrusion 100P and the second wire pattern 210.

The second wire pattern 210 may include a semiconductor element material such as Si or Ge. Also, the second wire pattern 210 may include a compound semiconductor such as, for example, a group IV-IV compound semiconductor or a group III-V compound semiconductor.

The second wire pattern 210 may include the same material as, or a different material from, the first wire pattern 110 and the fin-type protrusion 100P.

The first and second wire patterns 110 and 210 may be used as the channel regions of a transistor. For example, the first wire pattern 110, the second wire pattern 210, or both may be used as the channel region of an NMOS transistor. In another example, the first wire pattern 110, the second wire pattern 210, or both may be used as the channel regions of a PMOS transistor.

The interfacial film 120 may be formed along the circumferences of the first and second wire patterns 110 and 210. Accordingly, the interfacial film 120 may surround, e.g., completely surround, the first and second wire patterns 110 and 210.

The interfacial film 120 may be formed on the fin-type protrusion 100P. As illustrated in FIG. 19, the interfacial film 120 may be formed on the bottom of a trench TR2. The interfacial film 120 is illustrated as not being formed on the sidewalls of the trench TR2 but the interfacial film 120 may be formed on the sidewalls of the trench TR2 depending on how the interfacial film 120 is formed. In an example embodiment, the interfacial film 120 may not be provided.

The interfacial film 120 may include, for example, silicon oxide, etc. The interfacial film 120 may include a material other than silicon oxide depending on the type of the substrate 100, the type of the first wire pattern 110, the type of the second wire pattern 210, or the type of a gate insulating film 130.

Gate insulating films 130A and 130B may be formed on the interfacial film 120. The gate insulating films 130A and 130B may be formed along the circumferences of the first and second wire patterns 110 and 210, respectively. Accordingly, the gate insulating films 130A and 130B may surround, e.g., completely surround, the interfacial film 120.

The gate insulating films 130A and 130B may also be formed on the top surface of the field insulating film 105 and on the fin-type protrusion 100P. The gate insulating films 130A and 130B may extend along the inner sidewalls of the gate spacers 150. Thus, the gate insulating films 130A and 130B may extend along the sidewalls and the bottom of the trench TR2 and along the circumferences of the first and second wire patterns 110 and 210.

The gate electrode 140 may extend in the second direction Y over the substrate 100. As illustrated in FIG. 2, the gate electrode 140 may intersect the fin-type protrusion 100P and the first and second wire patterns 110 and 210.

The gate electrode 140 may be formed to surround, e.g., completely surround, the first and second wire patterns 110 and 210. The gate electrode 140 may be formed in between the fin-type protrusion 100P and the first wire pattern 110, and in between the first and second wire patterns 110 and 210.

The gate electrode 140 may be formed on the gate insulating films 130A and 130B. The gate electrode 140 may fill the trench TR2.

The lower conductive film 142 may be formed along the circumferences of the first and second wire patterns 110 and 210. Accordingly, the lower conductive film 142 may surround, e.g., completely surround, the gate insulating films 130A and 130B.

The lower conductive film 142 may also be formed on the top surface of the field insulating film 105 and on the fin-type protrusion 100P. The lower conductive film 142 may extend along the inner sidewalls of the gate spacers 150. Thus, the lower conductive film 142 may extend along the sidewalls and the bottom of the trench TR2, and along the circumferences of the first and second wire patterns 110 and 210.

The work function film 144 may be formed along the circumferences of the first and second wire patterns 110 and 210. Accordingly, the work function film 144 may surround, e.g., completely surround, the lower conductive film 142.

The work function film 144 may also be formed on the top surface of the field insulating film 105 and on the fin-type protrusion 100P. The work function film 144 may extend along the inner sidewalls of the gate spacers 150. Thus, the work function film 144 may extend along the sidewalls and the bottom of the trench TR2 and along the circumference of the first wire pattern 110.

The barrier film 146 may be formed on the top surface of the field insulating film 105 and on the fin-type protrusion 100P. The barrier film 146 may extend along the inner sidewalls of the gate spacers 150. Thus, the barrier film 146 may extend along the sidewalls and the bottom of the trench TR2.

The gate spacers 150 may be formed on both or opposite sidewalls of the gate electrode 140, which sidewalls extend in the second direction Y. For example, as illustrated in FIG. 19, the gate spacers 150 may be formed on both or opposite sides of the gate electrode 140 to face each other. The gate spacers 150 may define the trench TR2, which intersects the second wire pattern 210.

The gate spacers 150 may include the outer spacers 152 and the inner spacers 154. The inner spacers 154 may be disposed between the fin-type protrusion 100P and the first wire pattern 110 and between the first and second wire patterns 110 and 210. Although not specifically illustrated, the width, in the second direction Y, of the inner spacers 154 may be substantially the same as the width, in the second direction Y, of the first and second wire patterns 110 and 210.

The outer spacers 152 may be disposed on the inner spacers 154. FIG. 19 illustrates that the inner spacers 154 and the outer spacers 152 are sequentially disposed on the second wire pattern 210, etc. Thus, only the outer spacers 152 may be disposed on the second wire pattern 210 depending on the structure of a stack for forming the second wire pattern 210.

Figure 20:
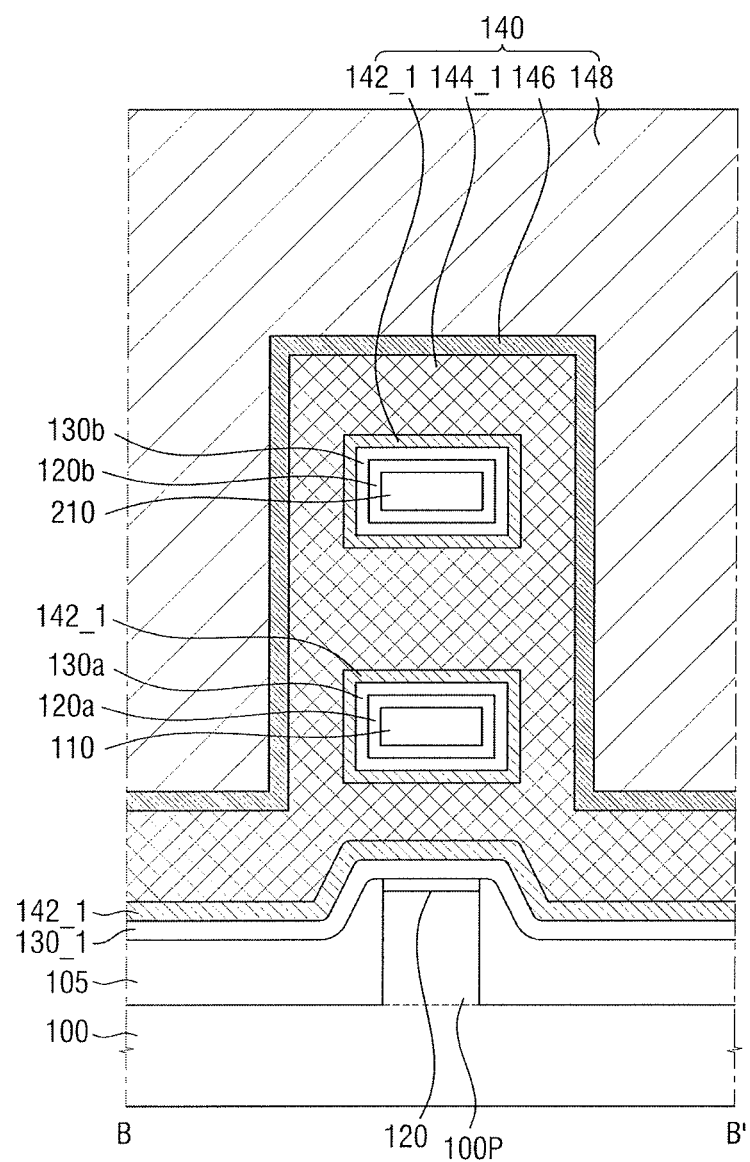
FIG. 20 illustrates a cross-sectional view, taken along line B-B' of FIG. 2, of a semiconductor device according to an example embodiment.

FIG. 20 illustrates a cross-sectional view, taken along line B-B' of FIG. 2, of a semiconductor device according to an example embodiment. The semiconductor device of FIG. 20 will hereinafter be described, focusing mainly on the differences with the semiconductor device of FIG. 6, which includes only the first wire pattern 110.

Referring to FIGS. 4 and 20, the gate electrode 140 may include the first portion 140_P0 that overlaps with the fin-type protrusion 100P in a second direction Y and the second portion 140_P1 that accounts for or corresponds to the rest of the gate electrode 140. The distance between the sidewalls of the fin-type protrusion 100P and the gate electrode 140 may increase away in a third direction Z from the top surface of the fin-type protrusion 100P. For example, the distance between the sidewalls of the fin-type protrusion 100P and the first portion 140_P0 of the gate electrode 140 may increase away from the top surface of the fin-type protrusion 100P in a downward direction.

In an example embodiment, the field insulating film 105 may be formed to at least partially surround both sidewalls of the fin-type protrusion 100P and may define the fin-type protrusion 100P. The field insulating film 105 may include the first region 105_R0 that overlaps with the first portion 140_P0 of the gate electrode 140 in the second direction Y and the second region 105_R1 that accounts for or corresponds to the rest of the field insulating film 105. Thus, the first region 105_R0 may be defined as a region that overlaps with the gate electrode 140 and the gate insulating film 130_1 in the second direction Y.

In further detail, as illustrated in FIG. 20, the field insulating film 105 may include the first region 105_R0 that is formed above the bottom surface of the gate insulating film 130_1 and the second region 105_R1 that is formed below the bottom surface of the gate insulating film 130_1. Accordingly, the field insulating film 105 may be formed not to surround the entire sidewalls of the fin-type protrusion 100P, but to surround only portions of the sidewalls of the fin-type protrusion 100P.

Figure 21:
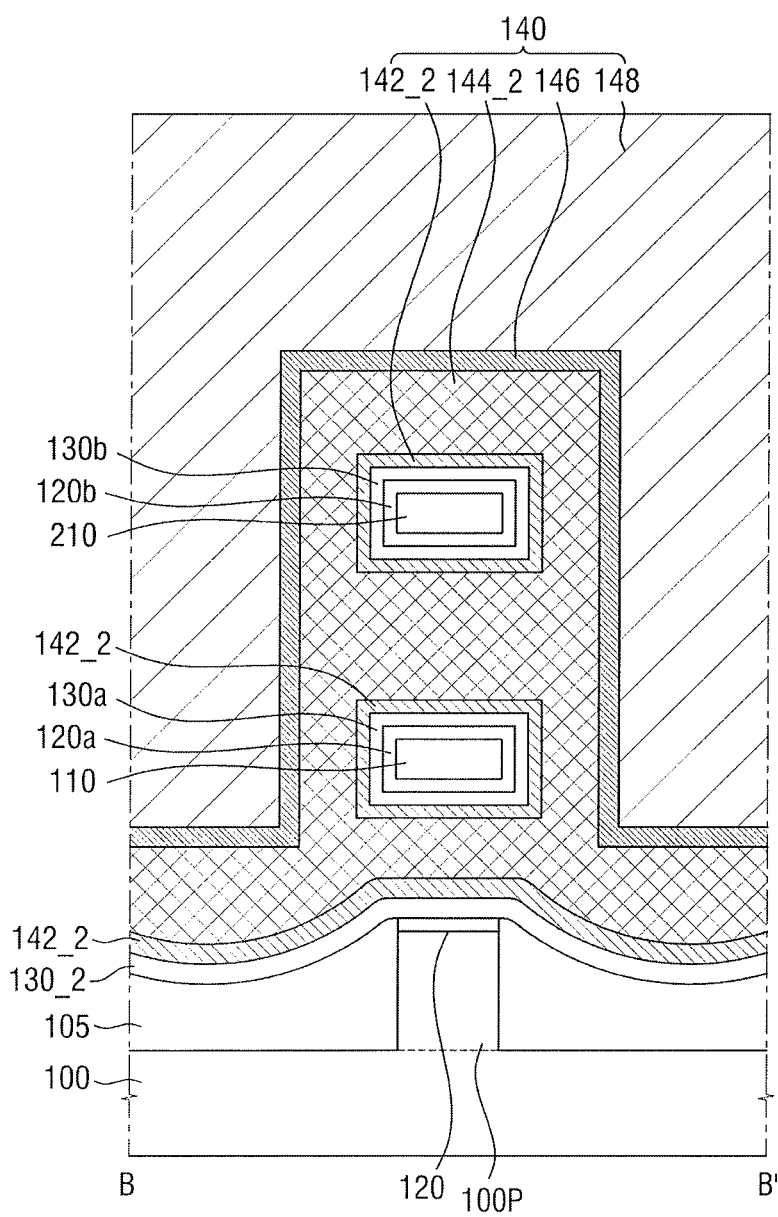
FIG. 21 illustrates a cross-sectional view, taken along line B-B' of FIG. 2, of a semiconductor device according to an example embodiment.

FIG. 21 illustrates a cross-sectional view, taken along line B-B' of FIG. 2, of a semiconductor device according to an example embodiment. The semiconductor device of FIG. 21 will hereinafter be described, focusing mainly on the differences with the semiconductor device of FIG. 15, which includes only the first wire pattern 110.

Referring to FIG. 21, the bottom surface of the gate electrode 140 may be formed to be recessed in the third direction Z. In an example embodiment, the bottom surfaces of the gate insulating film 130_2, the lower conductive film 142_2, and the work function film 144_2 (which are formed on the fin-type protrusion 100P) may be formed to be recessed in the third direction Z, e.g., forming a concave surface. For example, the fin-type protrusion 100P may be formed to be recessed in the third direction Z from the substrate 100.

Figure 22:
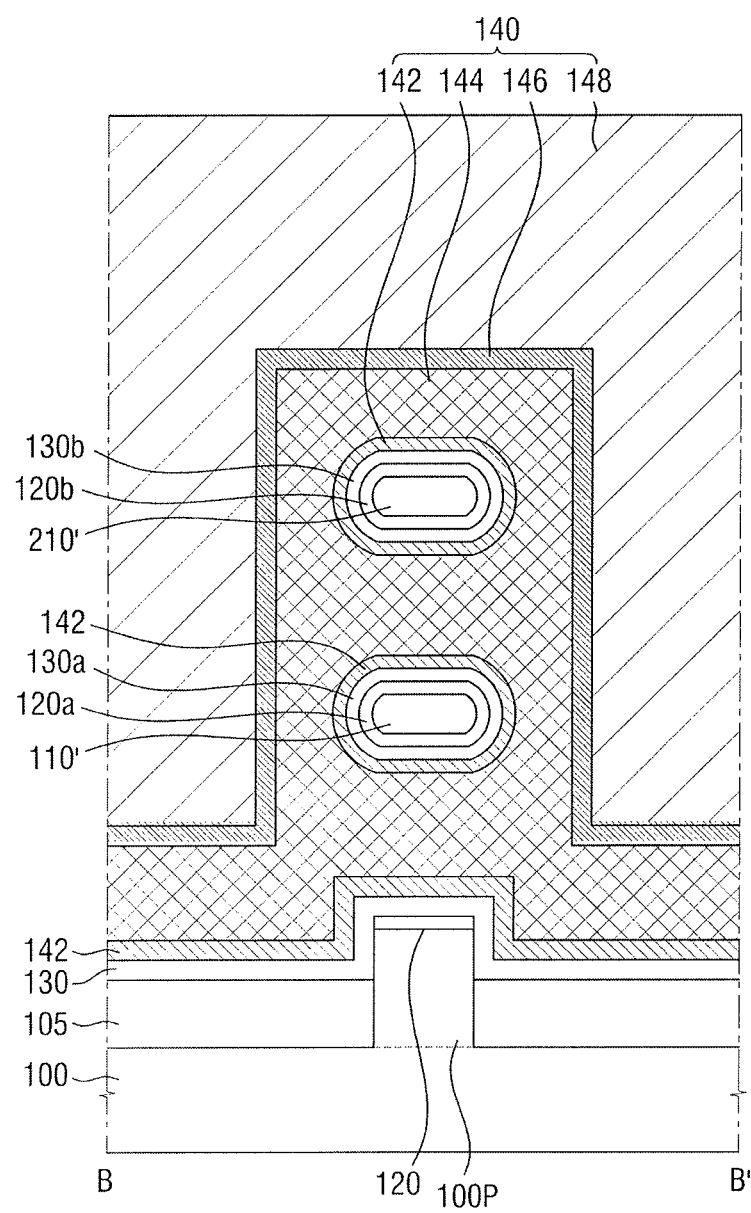
FIG. 22 illustrates a cross-sectional view, taken along line B-B' of FIG. 2, of a semiconductor device according to an example embodiment.

FIG. 22 illustrates a cross-sectional view, taken along line B-B' of FIG. 2, of a semiconductor device according to an example embodiment. The semiconductor device of FIG. 22 will hereinafter be described, focusing mainly on the differences with the semiconductor device of FIGS. 16 and 17, which includes only the first wire pattern 110.

Referring to FIG. 22, each of first and second wire patterns 110' and 210' may be formed in the shape of a figure comprising the combination of straight lines and curves. The cross sections of the first and second wire patterns 110' and 210' may have, for example, a rectangular shape with rounded corners. In an implementation, each of the first and second wire patterns 110' and 210' may be formed in the shape of a figure comprising the combination of curves.

Figure 23:
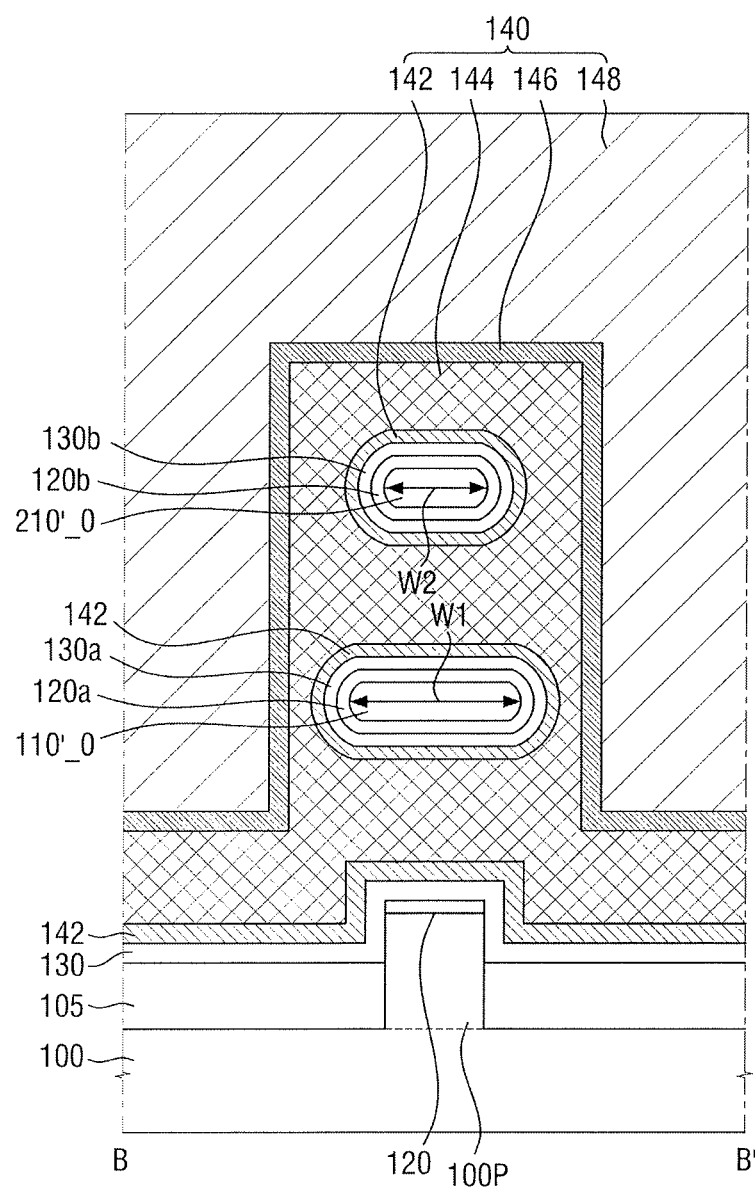
FIG. 23 illustrates a cross-sectional view, taken along line B-B' of FIG. 2, of a semiconductor device according to an example embodiment.

FIG. 23 illustrates a cross-sectional view, taken along line B-B' of FIG. 2, of a semiconductor device according to an example embodiment.

Referring to FIG. 23, In an example embodiment, a first width W1, in the second direction Y, of the first wire pattern 110' may be different from a second width W2, in the second direction Y, of the second wire pattern 210'. For example, the second width W2 of the second wire pattern 210' may be greater than the first width W1 of the first wire pattern 110'.

In an example embodiment, the width, in the second direction Y, of the fin-type protrusion 100P may be greater than the first width W1 of the first wire pattern 110' and the second width W2 of the second wire pattern 210'. Thus, the first width W1 of the first wire pattern 110' may be greater than the second width W2 of the second wire pattern 210', and the width, in the second direction Y, of the fin-type protrusion 100P may be greater than the first width W1 of the first wire pattern 110'. The width, in the second direction Y, of the fin-type protrusion 100P may refer to the width, in the second direction Y, of the top surface of the fin-type protrusion 100P.

Figure 24:
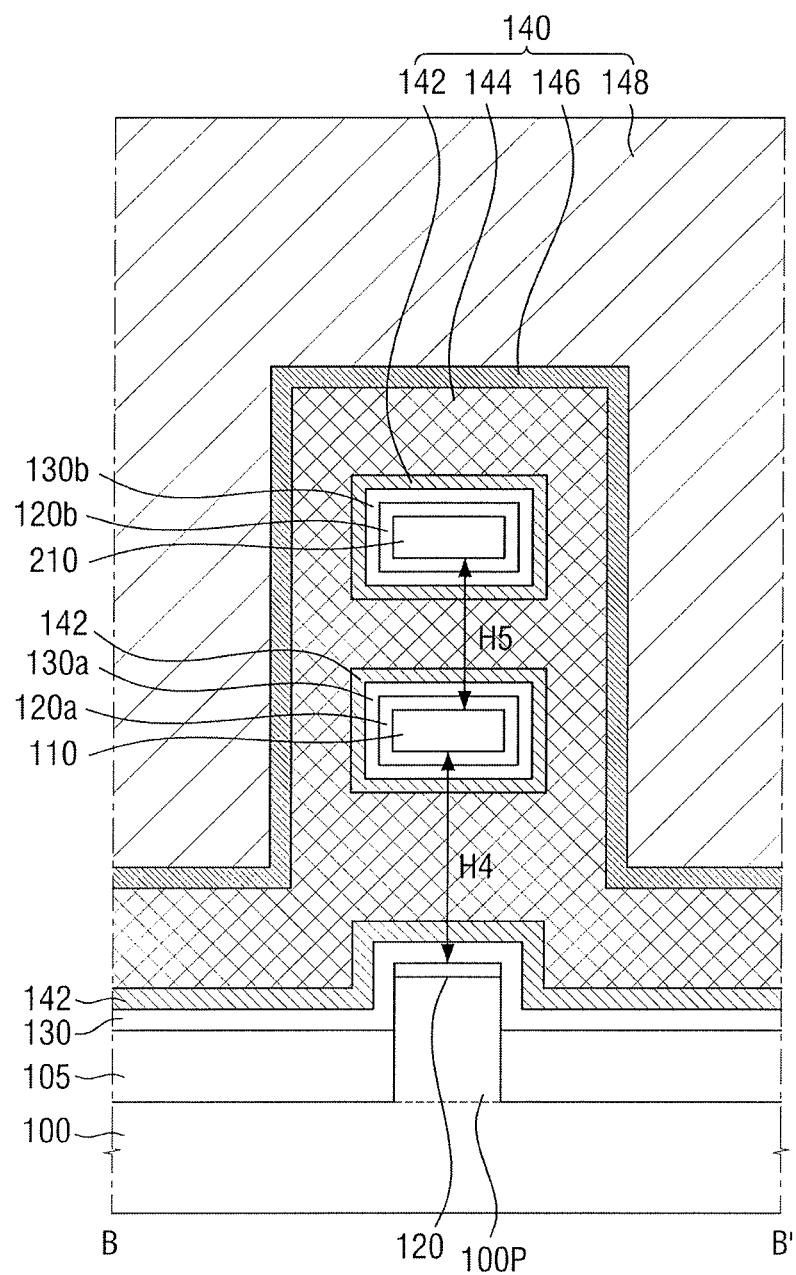
FIG. 24 illustrates a cross-sectional view, taken along line B-B' of FIG. 2, of a semiconductor device according to an example embodiment.

FIG. 24 illustrates a cross-sectional view, taken along line B-B' of FIG. 2, of a semiconductor device according to an example embodiment.

Referring to FIG. 24, in an example embodiment, the distance between the fin-type protrusion 100P and the first wire pattern 110 may be different from the distance between the first wire pattern 110 and the second wire pattern 210. As illustrated in FIG. 24, a distance H4, in the third direction Z, between the fin-type protrusion 100P and the first wire pattern 110 may be greater than a distance H5, in the third direction Z, between the first and second wire patterns 110 and 210. The distance H4 between the fin-type protrusion 100P and the first wire pattern 110 may refer to the distance between the top surface of the fin-type protrusion 100P and the bottom surface of the first wire pattern 110, i.e., the shortest distance between the fin-type protrusion 100P and the first wire pattern 110. Also, the distance H5 between the first and second wire patterns 110 and 210 may refer to the distance between the top surface of the first wire pattern 110 and the bottom surface of the second wire pattern 210, i.e., the shortest distance between the first and second wire patterns 110 and 210.

In an implementation, the distance H4 between the fin-type protrusion 100P and the first wire pattern 110 may refer to the distance, in the third direction Z, between part of the gate insulating film 130 disposed on the top surface of the fin-type protrusion 100P and part of the gate insulating film 130 disposed adjacent to the bottom surface of the first wire pattern 110. The distance H5 between the first and second wire patterns 110 and 210 may refer to the distance, in the third direction Z, between part of the gate insulating film 130 disposed on the top surface of the gate insulating film 130 and part of the gate insulating film 130 disposed adjacent to the bottom surface of the second wire pattern 210.

FIGS. 25 through 39 illustrate schematic views illustrating stages in a method of fabricating a semiconductor device according to an example embodiment. For convenience, FIGS. 25 through 39 illustrate how to fabricate a semiconductor device including two wire patterns, etc. Thus, the embodiment of FIGS. 25 through 39 is also applicable to a semiconductor device including only one wire pattern or three or more wire patterns.

Figure 25:
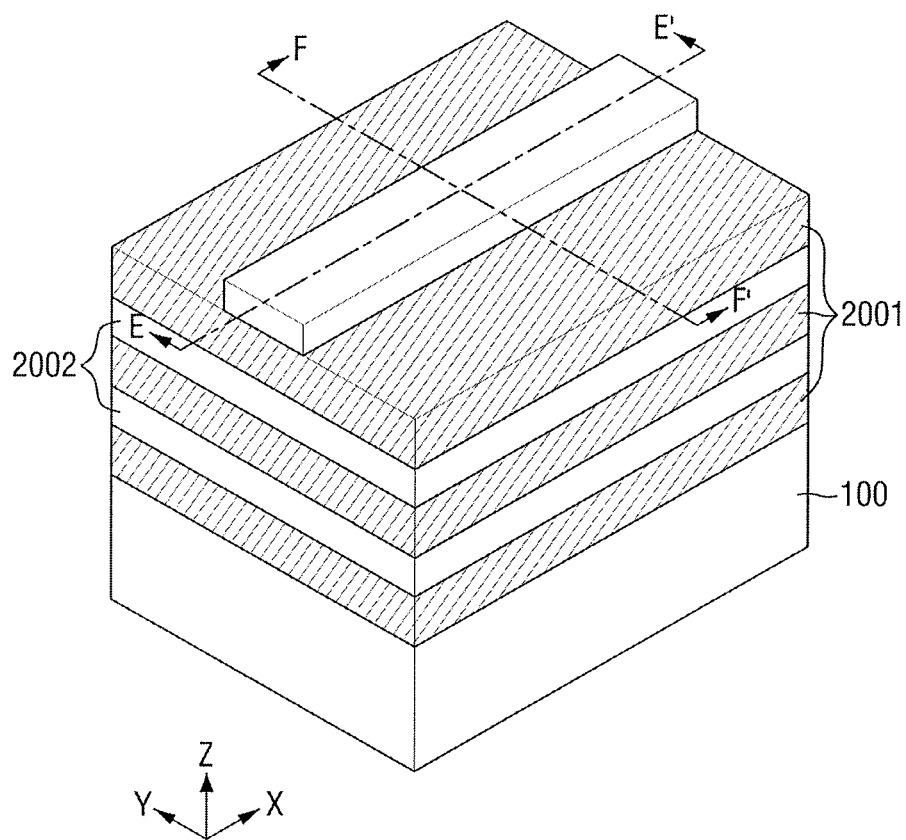
FIGS. 25 through 39 illustrate schematic views of stages in a method of fabricating a semiconductor device according to an example embodiment.

Specifically, FIGS. 26, 28, 30, 32, 34, 36, and 38 are cross-sectional views taken along line E-E' of FIG. 25, and FIGS. 27, 29, 31, 33, 35, 37, and 39 are cross-sectional views taken along line F-F' of FIG. 25.

Figure 26:
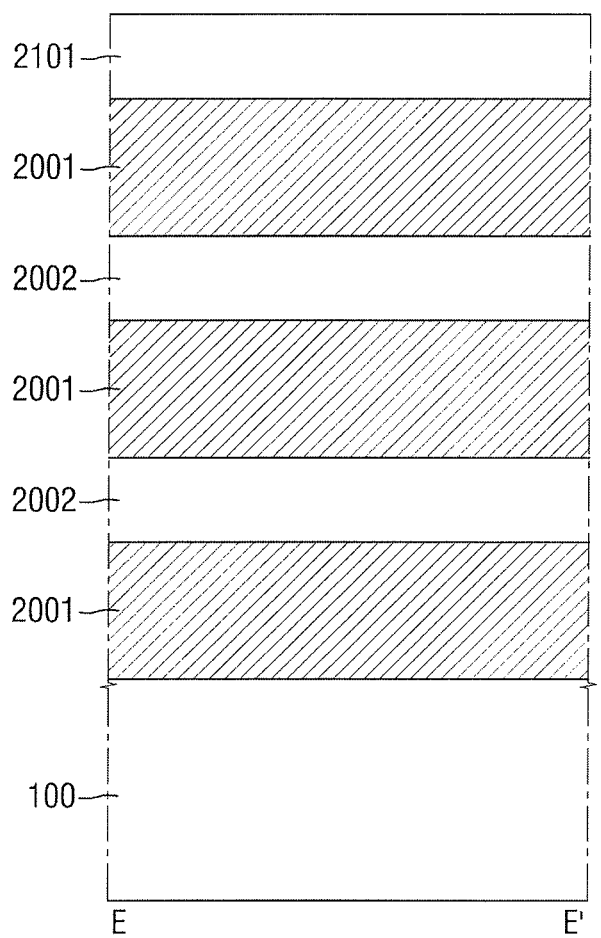
Figure 27:
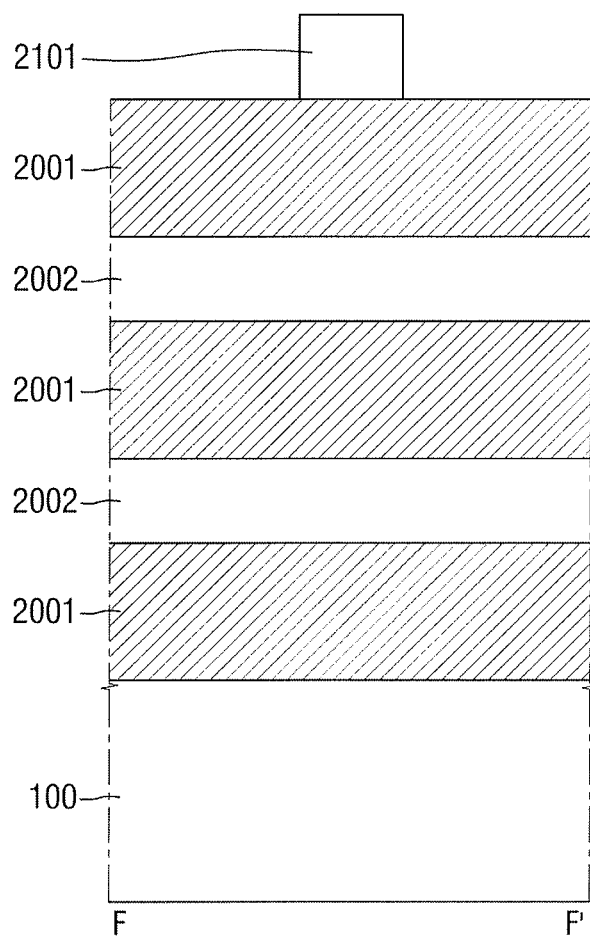

Referring to FIGS. 25 through 27, the substrate 100 may have sacrificial films 2001 and active films 2002 formed thereon in a stack of alternating layers. FIG. 25 illustrates that three sacrificial films 2001 and two active films 2002 are formed on the substrate 100, etc. FIG. 25 also illustrates that the uppermost layer of the stack of the sacrificial films 2001 and the active films 2002 is a sacrificial film 2001, as an example. The active films 2002 may include a material having etching selectivity with respect to the sacrificial films 2001. The sacrificial films 2001 and the active films 2002 may be formed by, for example, epitaxial growth.

Thereafter, a first mask pattern 2101 may be formed on the uppermost sacrificial film 2001. The first mask pattern 2101 may extend in a first direction X.

Figure 28:
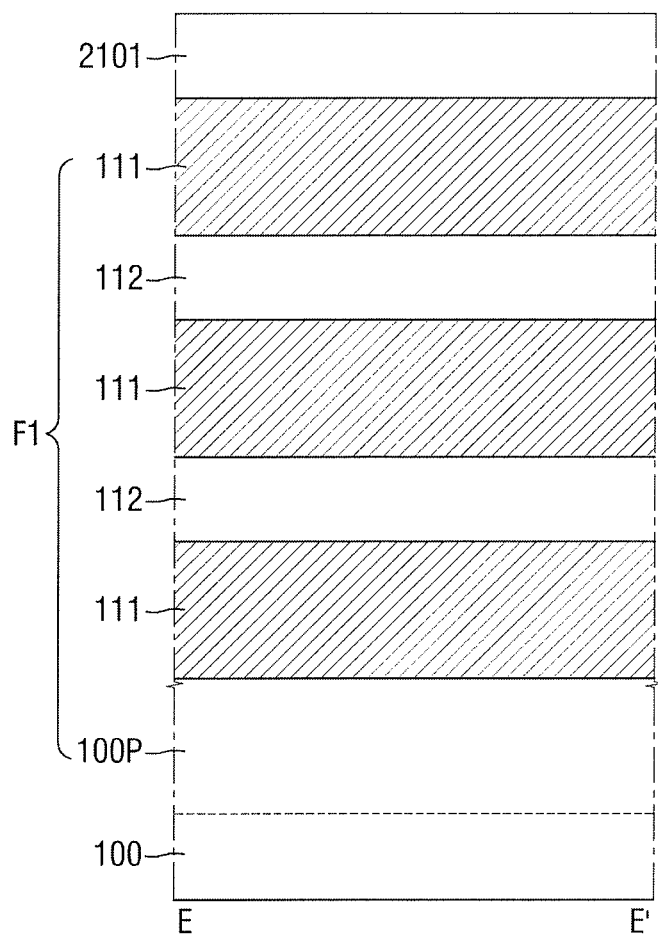
Figure 29:
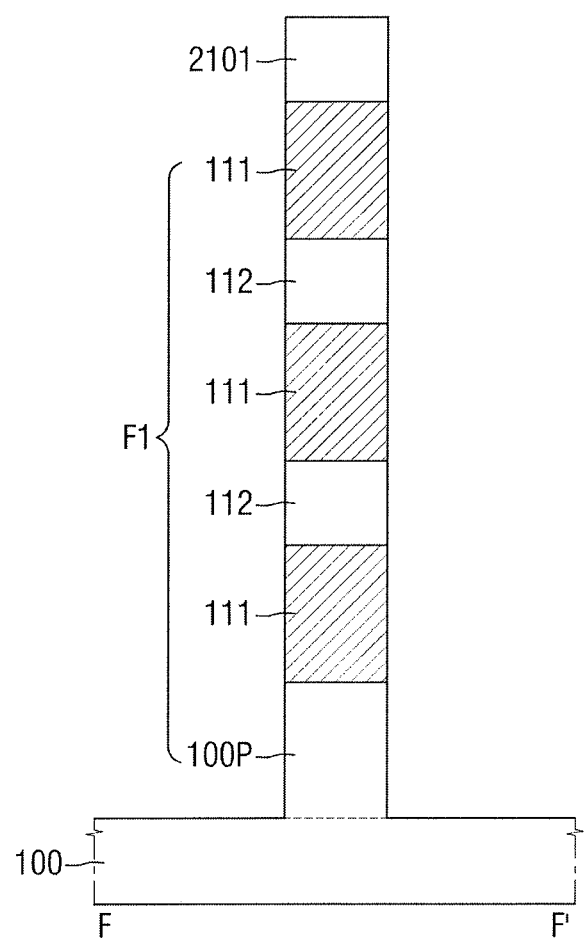

Referring to FIGS. 28 and 29, a fin-type structure F1 may be formed by performing etching using the first mask pattern 2101 as a mask. The fin-type structure F1 may include a fin-type protrusion 100P and sacrificial patterns 111 and active patterns 112 that are alternately stacked on the fin-type protrusion 100P.

Figure 31:
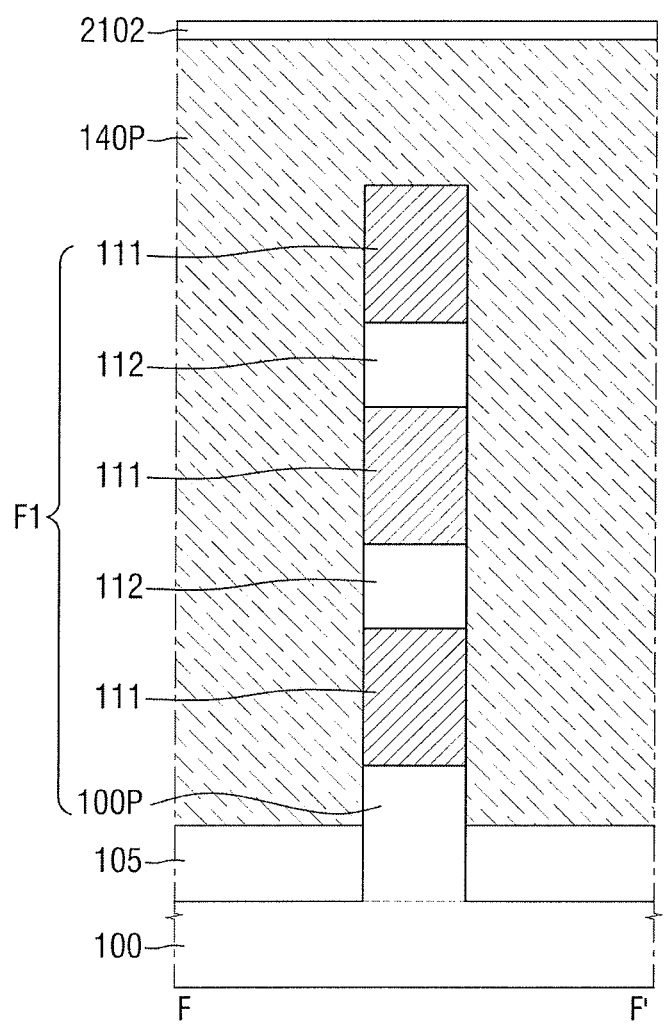

Thereafter, a field insulating film 105 may be formed on the substrate 100 to at least partially cover the sidewalls of the fin-type structure F1 (see FIG. 31). During the formation of the field insulating film 105, the first mask pattern 2101 may be removed. The field insulating film 105 may be formed below the top surface of the fin-type protrusion 100P. Thus, as described above with reference to FIGS. 3 and 4, the top surface of the field insulating film 105 may be below the top surface of the fin-type protrusion 100P.

Figure 30:
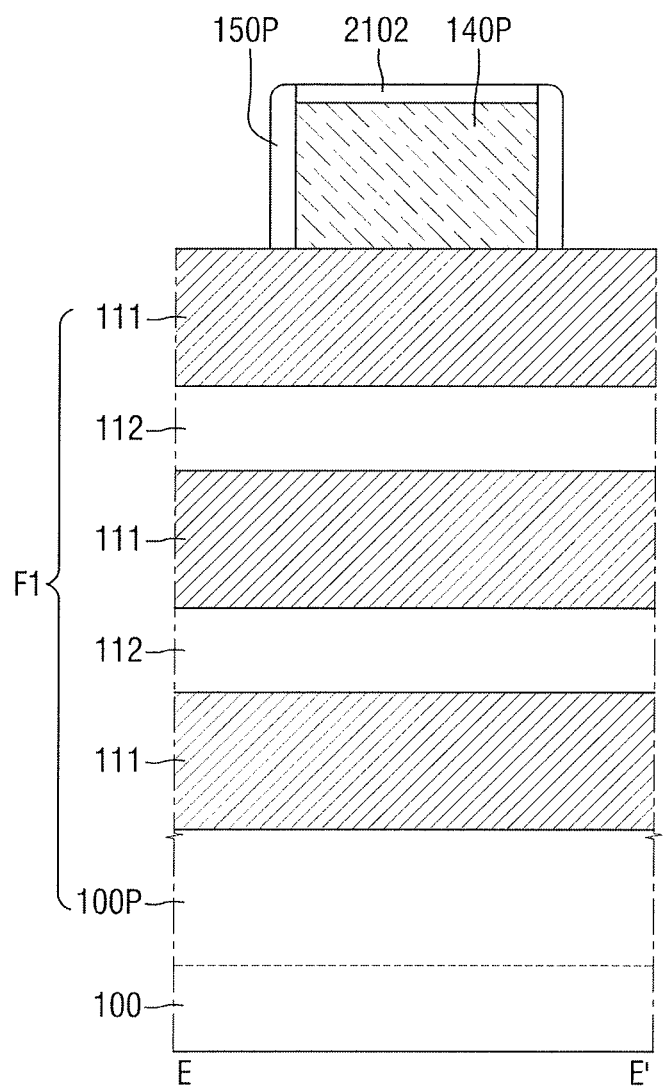

Referring to FIGS. 30 and 31, a dummy gate electrode 140P that intersects the fin-type structure F1 and extends in the second direction Y may be formed.

The dummy gate electrode 140P may be formed by using a second mask pattern 2102 as a mask.

Although not specifically illustrated, a dummy gate insulating film or a fin-type structure passivation film may be further formed between the dummy gate electrode 140P and the fin-type structure F1.

Pre-gate spacers 150P may be formed on the sidewalls of the dummy gate electrode 140P.

Figure 32:
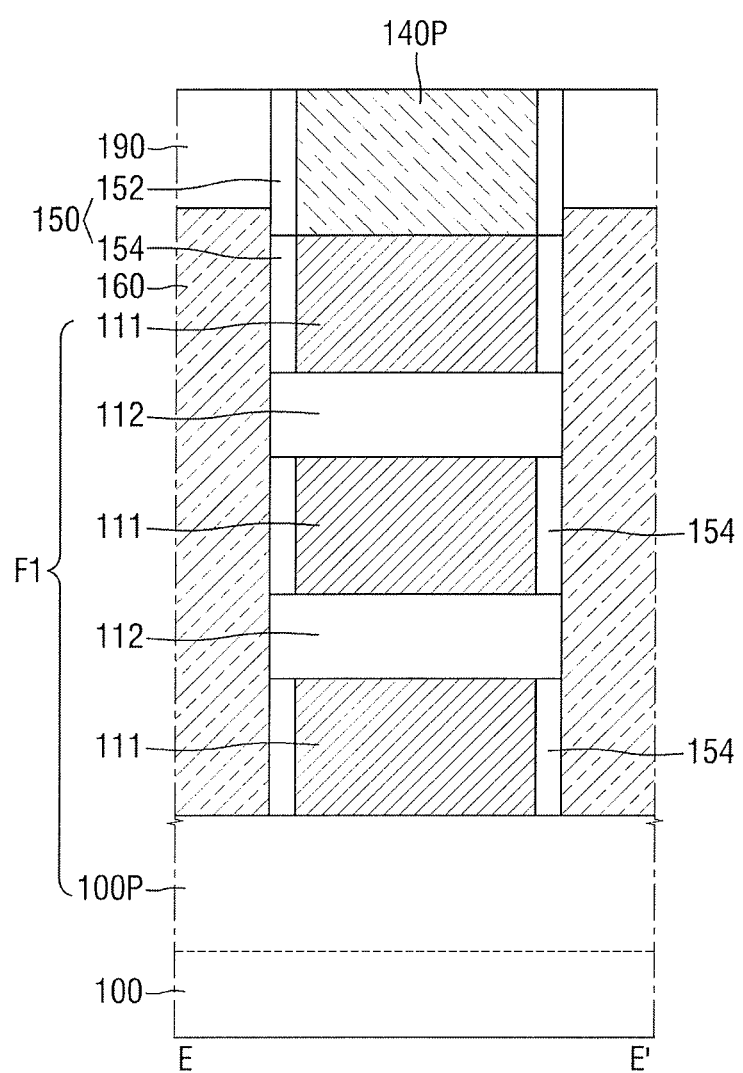
Figure 33:
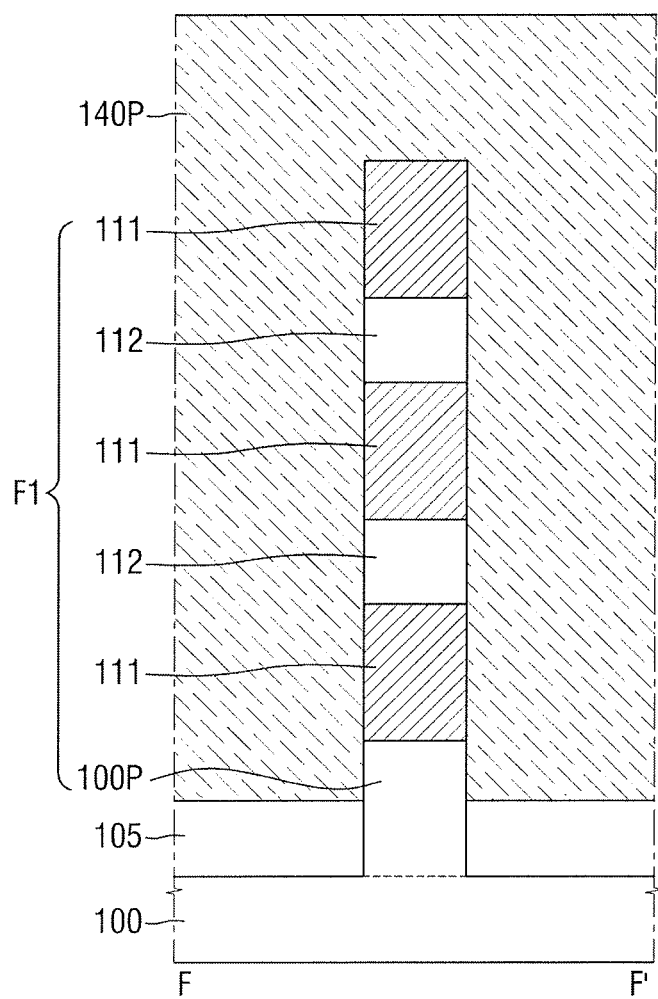

Referring to FIGS. 32 and 33, source/drain regions 160 may be formed on both sides of the dummy gate electrode 140P.

In an example embodiment, portions of the sacrificial patterns 111 and portions of the active patterns 112 may be removed to form the source/drain regions 160.

Thereafter, portions of the sacrificial patterns 111 that overlap with the pre-gate spacers 150P may be additionally removed.

The inner spacers 154 may be formed at locations where the sacrificial patterns 111 are additionally removed.

Thereafter, the source/drain regions 160 may be formed on both sides of the dummy gate electrode 140P.

Thereafter, the interlayer insulating film 190 that covers the source/drain regions 160 may be formed on the substrate 100.

The dummy gate electrode 140P may be exposed by the interlayer insulating film 190.

During the formation of the interlayer insulating film 190, the second mask pattern 2102 may be removed. Also, during the formation of the interlayer insulating film 190, the outer spacers 152 may be formed on inner spacers 154.

In this manner, the gate spacers 150 including the inner spacers 154 and the outer spacers 152 may be formed.

Figure 34:
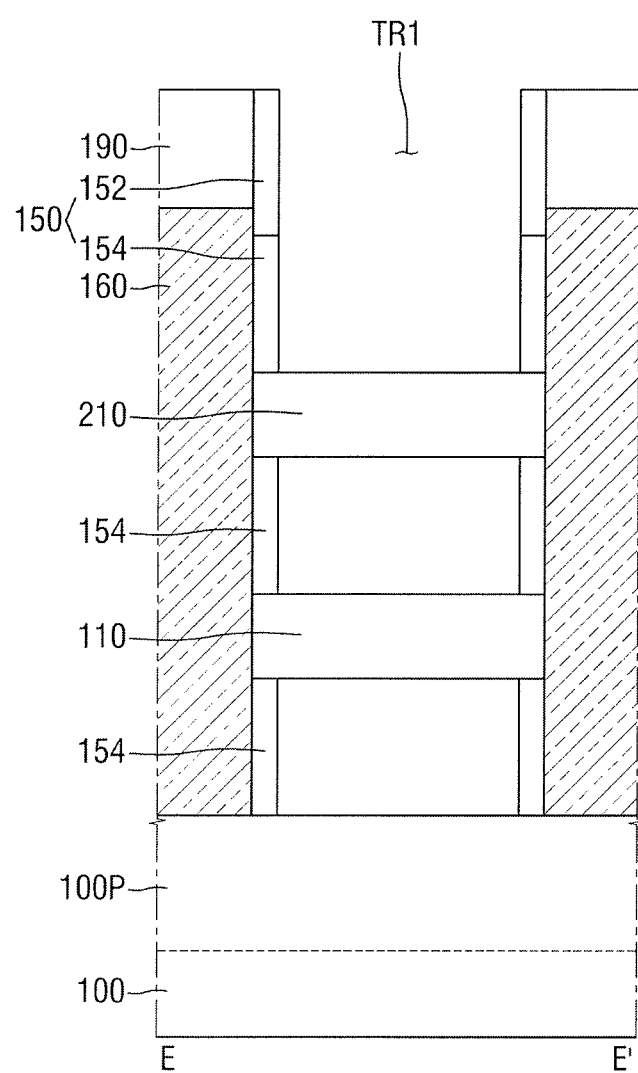
Figure 35:
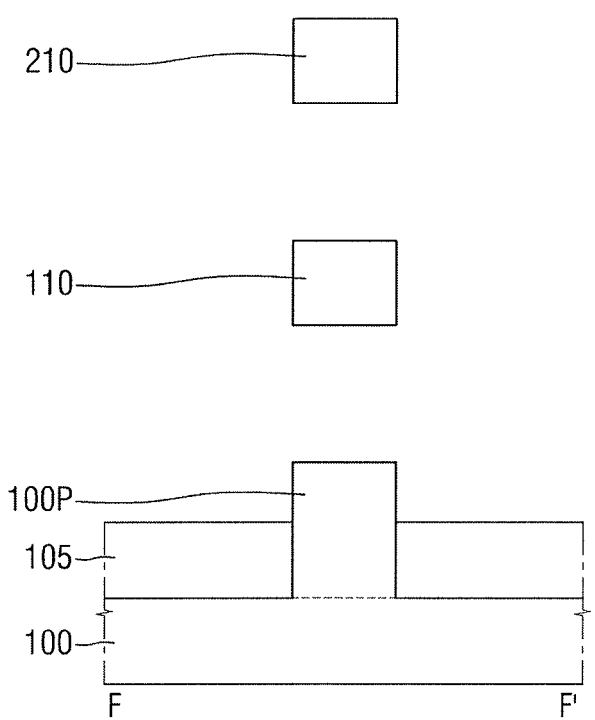

Referring to FIGS. 34 and 35, the first and second wire patterns 110 and 210 may be formed on the substrate 100 by removing the dummy gate electrode 140P and the sacrificial patterns 111.

The first wire pattern 110 may be formed to be spaced apart from the fin-type protrusion 100P, and the second wire pattern 210 may be formed to be spaced apart from the first wire pattern 110.

After the removal of the sacrificial patterns 111, the fin-type protrusion 100P, the first wire pattern 110, and the second wire pattern 210 may be subjected to a surface treatment process. The surface treatment process may be performed using, for example, one of H2 bake, a rapid thermal process (RTP), hydrogen plasma annealing (HPA), and a wet process. By performing the surface treatment process on the fin-type protrusion 100P, the first wire pattern 110, and the second wire pattern 210 after the removal of the sacrificial patterns 111, channel roughness on the top surface and the sidewalls of the fin-type protrusion 100P, the sides of the first wire pattern 110, and the sides of the second wire pattern 210 may be improved, i.e., reduced.

Figure 36:
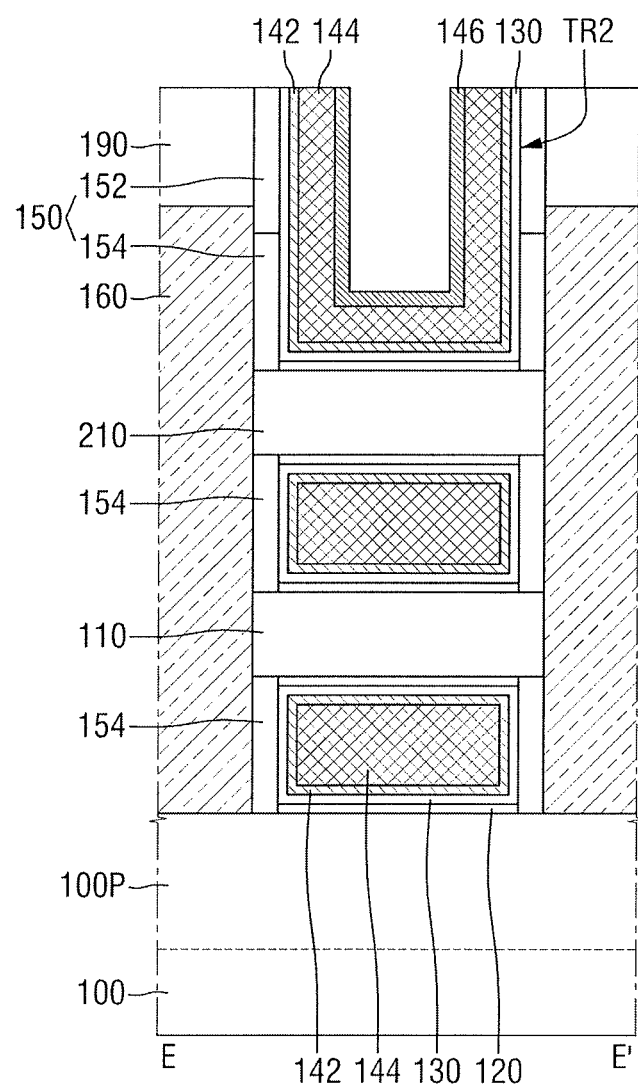
Figure 37:
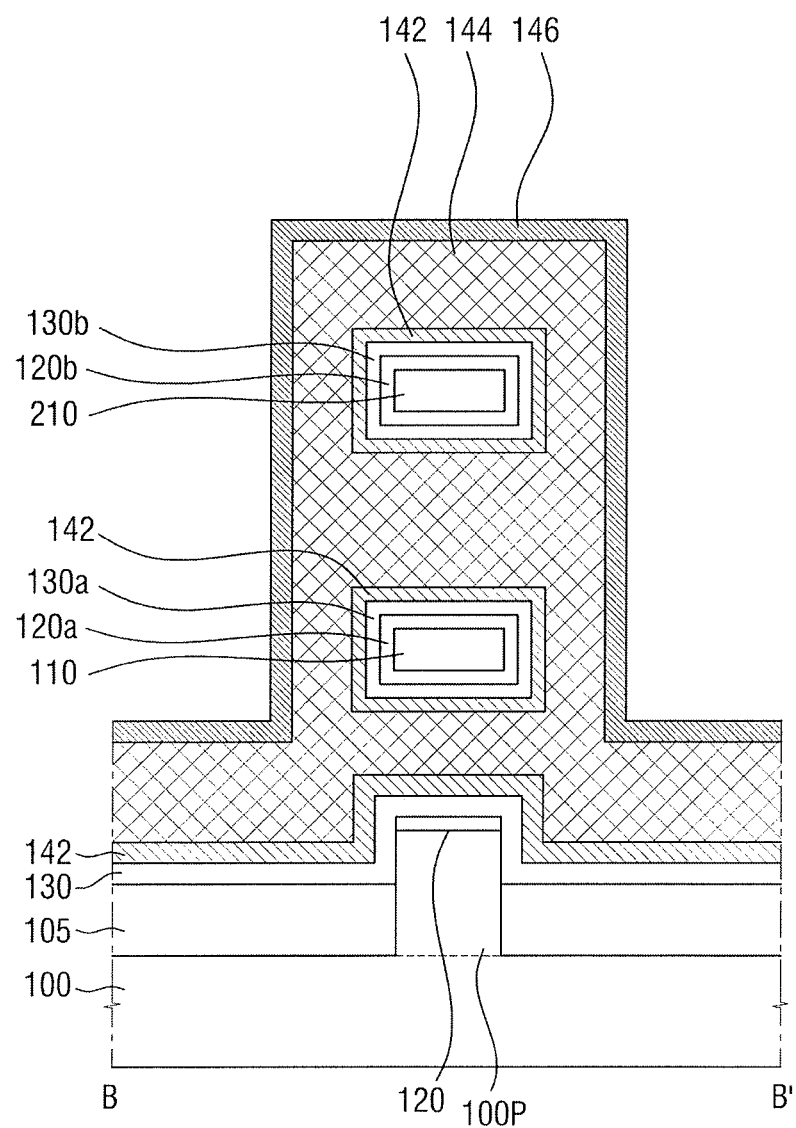

Referring to FIGS. 36 and 37, the interfacial film 120 may be formed along the circumferences of the first and second wire patterns 110 and 210. The interfacial film 120 may be formed by oxidizing the surfaces of the first wire patterns 110 and 210, for example.

Thereafter, the gate insulating film 130, the lower conductive film 142, the work function film 144, and the barrier film 146 may be sequentially formed along the circumferences of the first and second wire patterns 110 and 210 and along the sidewalls and the bottom of the trench TR1.

The bottom of the gate electrode 140 may be formed below the top surface of the fin-type protrusion 100P. Thus, as described above with reference to FIG. 18, part of the gate electrode 140 disposed adjacent to the fin-type protrusion 100P, particularly, part of the lower conductive film 142, may be formed below the fin-type protrusion 100P in the third direction Z. In an example embodiment, part of the lower conductive film 142 and part of the gate insulating film 130 may be formed below the top surface of the fin-type protrusion 100P in the third direction Z. Accordingly, the gate electrode 140 may be uniformly formed on the top surface of the fin-type protrusion 100P. For example, the gate electrode 140 or the gate insulating film 130 may be formed along the edges of the top surface of the fin-type protrusion 100P not to protrude in the third direction Z, and as a result, channel mobility may be improved.

Although not specifically illustrated, the gate insulating film 130, the lower conductive film 142, the work function film 144, and the barrier film 146 may be formed along the top surface of the interlayer insulating film 190.

In an example embodiment, the formation of the work function film 144 and the formation of the barrier film 146 may be performed in situ.

Figure 38:
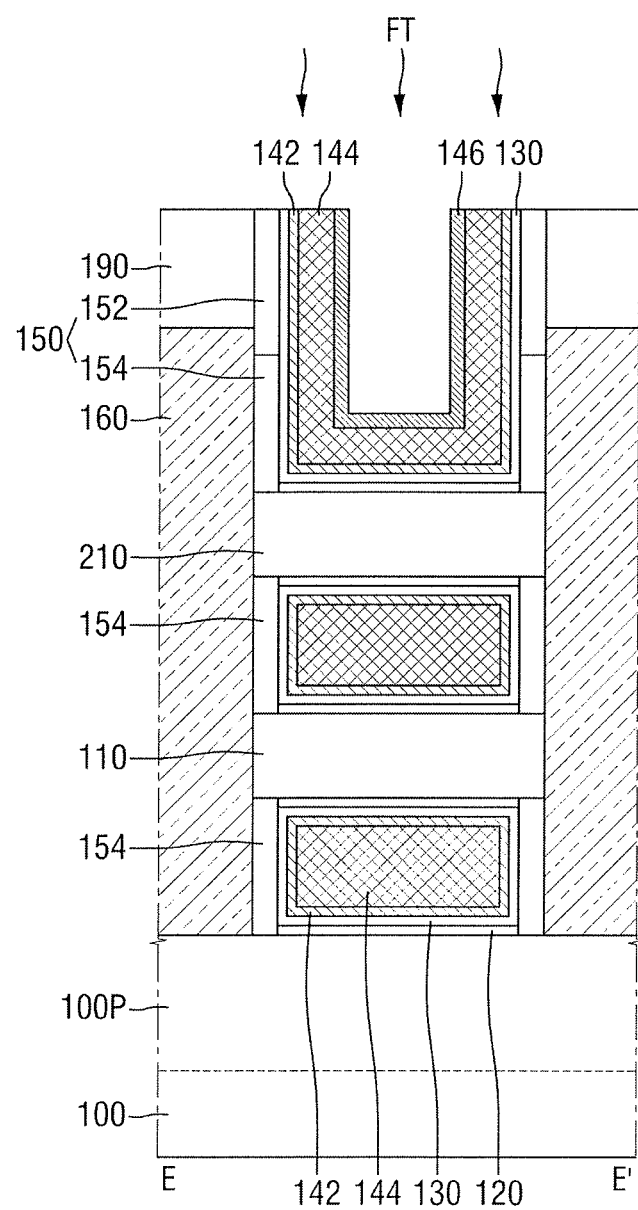
Figure 39:
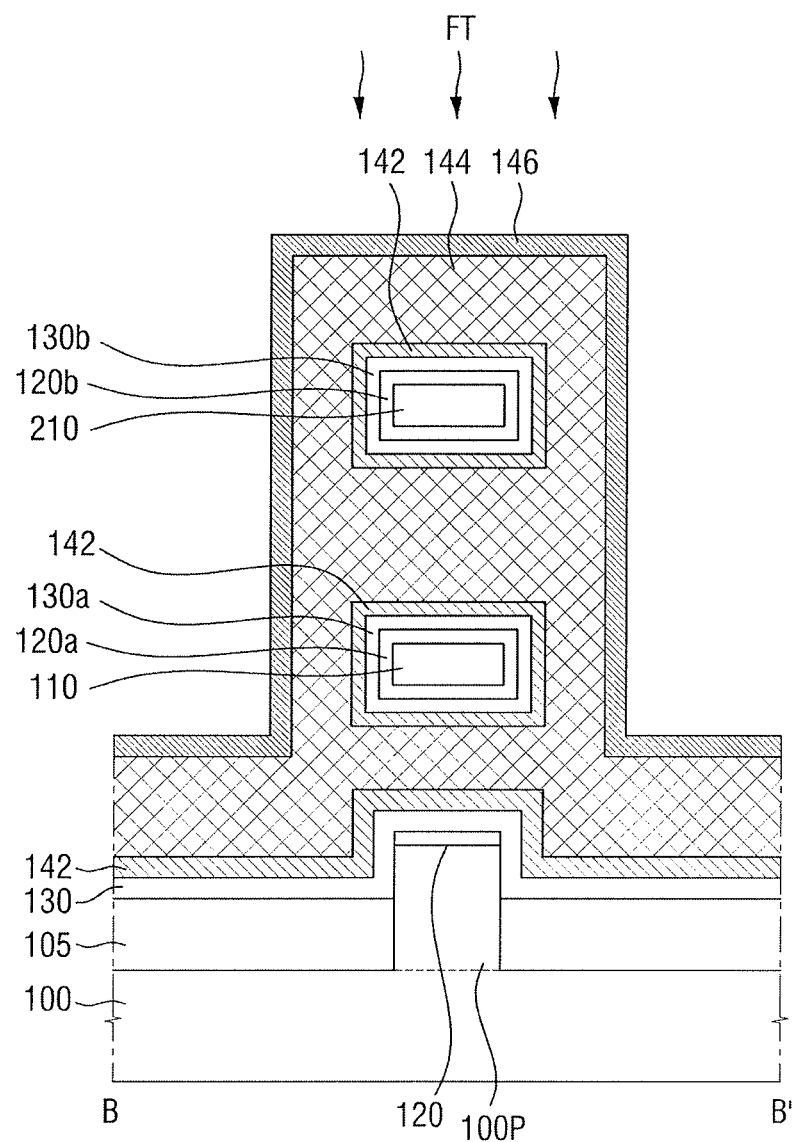

Referring to FIGS. 38 and 39, a film treatment (FT) process may be performed on the work function film 144. As a result, a carbon concentration gradient in the work function film 144 may be controlled. The FT process may include at least one of, for example, plasma treatment, annealing, ultraviolet (UV) treatment, and a combination thereof. For example, the FT process may include hydrogen plasma treatment.

Thereafter, referring back to FIGS. 18 and 19, the filling conductive film 148 may be formed on the barrier film 146. Accordingly, the gate electrode 140 including the lower conductive film 142, the work function film 144, the barrier film 146, and the filling conductive film 148 may be formed.

By way of summation and review, as a scaling technique for increasing the density of a semiconductor device, a gate-all-around structure has been suggested in which a nanowire-shape silicon body is formed on a substrate and a gate is formed to surround the silicon body. Since the gate-all-around structure uses a three-dimensional (3D) channel, scaling may be facilitated. Also, current control capability may be improved without increasing the length of the gate. Also, a short channel effect (SCE), i.e., the phenomenon of the potential of a channel region being affected by a drain voltage, may be effectively suppressed.

As described above, embodiments relate to a semiconductor device including a gate electrode that is formed below the top surface of a fin-type pattern. Embodiments may provide a semiconductor device capable of improving operating performance and reliability by improving the roughness on the surface of a channel region. Embodiments may provide a semiconductor device capable of improving channel mobility by removing any protruding portions on the surface of a fin-type pattern. Embodiments may provide a method of fabricating a semiconductor device capable of improving operating performance and reliability by improving the roughness on the surface of a channel region. Embodiments may provide a method of fabricating a semiconductor device capable of improving channel mobility by removing any protruding portions on the surface of a fin-type pattern.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   a fin-type pattern on a substrate, the fin-type pattern extending in a first direction and protruding from the substrate in a third direction;
   a first wire pattern on the fin-type pattern, the first wire pattern being spaced apart from a top surface of the fin-type pattern in the third direction;
   a field insulating film that at least partially surrounds both sidewalls of the fin-type pattern to define the fin-type pattern;
   an interfacial film on the top surface of the fin-type pattern; and
   a gate electrode extending in a second direction, which is perpendicular to the first and third directions, and surrounding the first wire pattern,
   wherein the sidewalls include a first portion covering the field insulating film, and a second portion on the first portion, connected to the top surface of the fin-type pattern, and
   wherein the gate electrode includes a first portion that overlaps with the second portion of the sidewalls of the fin-type pattern in the second direction and a second portion corresponding to a remainder of the gate electrode except for the first portion of the gate electrode.

2. The semiconductor device as claimed in claim 1, wherein the field insulating film includes a first region that overlaps with the first portion of the gate electrode and a second region corresponding to a remainder of the field insulating film except for the first region.

3. The semiconductor device as claimed in claim 1, wherein a bottom surface of the gate electrode is recessed in the third direction.

4. The semiconductor device as claimed in claim 1, further comprising:
gate spacers at least partially overlapping with the first wire pattern in the third direction; and
an epitaxial pattern disposed on both sides of the first wire pattern,
wherein the gate electrode is disposed between the gate spacers.

5. The semiconductor device as claimed in claim 4, wherein:
the gate spacers define a trench, and
the semiconductor device further comprises a gate insulating film that extends along sidewalls of the trench and along a circumference of the first wire pattern.

6. The semiconductor device as claimed in claim 1, further comprising a second wire pattern spaced apart from the first wire pattern in the third direction and intersecting the gate electrode.

7. The semiconductor device as claimed in claim 6, wherein a width, in the second direction, of the first wire pattern is greater than a width, in the second direction, of the second wire pattern.

8. The semiconductor device as claimed in claim 6, wherein a distance, in the third direction, between the fin-type pattern and the first wire pattern is greater than a distance, in the third direction, between the first and second wire patterns.

9. The semiconductor device as claimed in claim 1, wherein a distance between sidewalls of the fin-type pattern and the gate electrode increases away from top surface of the fin-type pattern.

10. The semiconductor device as claimed in claim 1, wherein a distance, in the third direction, between a bottom surface of the first portion of the gate electrode and a top surface of the fin-type pattern is 50 nm or less.

11. The semiconductor device as claimed in claim 1, further comprising a field liner on a top surface of the substrate, the field liner being on at least portions of sidewalls of the fin-type pattern.

12. A semiconductor device, comprising:
a fin-type pattern protruding from a substrate;
a first wire pattern on the fin-type pattern, the first wire pattern being spaced apart from the fin-type pattern in a third direction,
a field insulating film that at least partially surrounds both sidewalls of the fin-type pattern to define the fin-type pattern;
an interfacial film on a top surface of the fin-type pattern, and
a gate electrode intersecting the first wire pattern,
wherein a distance between the top surface of the fin-type pattern and an end of the first wire pattern is the same as or greater than distances between the top surface of the fin-type pattern and parts of the first wire pattern other than the end, and
wherein the sidewalls include a first portion covering the field insulating film, and a second portion on the first portion, connected to the top surface of the fin-type pattern,
wherein the gate electrode includes a first portion that overlaps with the second portion of the sidewalls of the fin-type pattern in a second direction and a second portion corresponding to a remainder of the gate electrode except for the first portion of the gate electrode.

13. The semiconductor device as claimed in claim 12, wherein a distance between sidewalls of the fin-type pattern and the gate electrode increases away from the top surface of the fin-type pattern.

14. The semiconductor device as claimed in claim 12, further comprising a second wire pattern spaced apart from the first wire pattern,
wherein a distance, at an end of the second wire pattern, between the second wire pattern and a top surface of the first wire pattern is the same as or greater than a distance, at other parts of the second wire pattern except for the end, between the second wire pattern and the top surface of the first wire pattern.

15. The semiconductor device as claimed in claim 14, wherein the first wire pattern includes a first region that overlaps with the second wire pattern and a second region that does not overlap with the second wire pattern.

16. The semiconductor device as claimed in claim 14, wherein edges of the first and second wire patterns are curved.

17. A semiconductor device, comprising:
a fin-type pattern protruding from a substrate;
a wire pattern spaced apart from a top surface of the fin-type pattern;
a field insulating film that at least partially surrounds both sidewalls of the fin-type pattern to define the fin-type pattern;
an interfacial film on the top surface of the fin-type pattern; and
a gate electrode surrounding the wire pattern,
wherein the gate electrode includes a first portion that overlaps with at least part of the sidewalls of the fin-type pattern in a second direction and a second portion corresponding to a remainder of the gate electrode except for the first portion of the gate electrode.

18. The semiconductor device as claimed in claim 17, wherein:
a bottom surface of the gate electrode is below the top surface of the fin-type pattern, and
a distance between the top surface of the fin-type pattern and the bottom surface of the gate electrode is 50 nm or less.

* * * * *